United States Patent
Fang

(10) Patent No.: US 11,249,591 B2
(45) Date of Patent: Feb. 15, 2022

(54) SHIFT REGISTER UNIT AND DRIVING METHOD, GATE DRIVER, TOUCH DISPLAY PANEL, AND TOUCH DISPLAY DEVICE

(71) Applicants: Hefei BOE Optoelectronics Technology Co., Ltd., Anhui (CN); BOE Technology Group Co., Ltd., Beijing (CN)

(72) Inventor: Zhixiang Fang, Beijing (CN)

(73) Assignees: Hefei BOE Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/954,906

(22) PCT Filed: Jan. 21, 2020

(86) PCT No.: PCT/CN2020/073553
§ 371 (c)(1),
(2) Date: Jun. 17, 2020

(87) PCT Pub. No.: WO2020/168895
PCT Pub. Date: Aug. 27, 2020

(65) Prior Publication Data
US 2021/0216187 A1    Jul. 15, 2021

(30) Foreign Application Priority Data

Feb. 18, 2019   (CN) .......................... 201910120632.4

(51) Int. Cl.
*G06F 3/041*  (2006.01)
*G09G 3/20*  (2006.01)
*G11C 19/28*  (2006.01)

(52) U.S. Cl.
CPC .......... *G06F 3/04166* (2019.05); *G09G 3/20* (2013.01); *G11C 19/28* (2013.01);
(Continued)

(58) Field of Classification Search
CPC ......... G09G 2310/0286; G09G 3/3266; G09G 2310/0289; G09G 3/20; G09G 2310/08;
(Continued)

(56) References Cited

U.S. PATENT DOCUMENTS 9,916,039 B2 * 3/2018 Gu ....................... G09G 3/2092
10,115,335 B2 * 10/2018 Zheng ................... G09G 3/2092
(Continued)

*Primary Examiner* — Duc Q Dinh
(74) *Attorney, Agent, or Firm* — Banner & Witcoff, Ltd.

(57) ABSTRACT

A shift register unit, a driving method for driving the shift register unit, a gate driver, a touch display panel, and a touch display device are disclosed. The shift register unit includes an input circuit being configured to control a level of a first node in response to an input pulse received at an input terminal; a first control circuit being configured to, under control of the input pulse received at the input terminal and a touch enable signal received a touch enable signal terminal, connect a first scan voltage terminal to the first node to control the level of the first node; an output circuit being configured to connect a clock terminal to an output terminal in response to a potential of the first node, to output a clock signal received by the clock terminal at the output terminal.

20 Claims, 10 Drawing Sheets

(52) U.S. Cl.
CPC ............... *G09G 2310/0286* (2013.01); *G09G 2310/061* (2013.01); *G09G 2310/08* (2013.01)

(58) Field of Classification Search
CPC ..... G09G 2310/061; G09G 2300/0426; G09G 3/3674; G09G 2310/06; G09G 2320/0247; G09G 2320/0214; G09G 3/3677; G09G 2310/0267; G02F 1/13338; G02F 1/136286; G02F 1/13458; G06F 3/04166; G06F 3/041; G06F 3/0445; G06F 3/0412; G06F 3/044; G06F 3/0443; G06F 3/04164; G06F 3/04182; G06F 3/03547; G11C 19/28
See application file for complete search history.

(56) References Cited

U.S. PATENT DOCUMENTS

| | | | |
|---|---|---|---|
| 2017/0010731 A1* | 1/2017 | Zhang | G06F 3/04184 |
| 2017/0123556 A1* | 5/2017 | Lin | G09G 3/20 |
| 2018/0190364 A1* | 7/2018 | Gu | G11C 8/04 |

* cited by examiner

SHIFT REGISTER UNIT AND DRIVING METHOD, GATE DRIVER, TOUCH DISPLAY PANEL, AND TOUCH DISPLAY DEVICE

This application is a U.S. National Phase Entry of International Application No. PCT/CN2020/073553 filed on Jan. 21, 2020, designating the United States of America and claiming priority to Chinese Patent Application No. 201910120632.4, filed on Feb. 18, 2019. The present application claims priority to and the benefit of the above-identified applications and the above-identified applications are incorporated by reference herein in their entirety.

TECHNICAL FIELD

The embodiments of the present disclosure relate to a shift register unit and a driving method thereof, a gate driver, a touch display panel, and a touch display device

BACKGROUND

In a field of display technology, for example, a pixel array of a liquid crystal display panel generally includes a plurality of rows of gate lines and a plurality of columns of data lines, and the gate lines are interleaved with the data lines. The driving of the gate lines can be implemented by a bonding integrated driving circuit. In recent years, with the continuous improvement of the preparation process of amorphous silicon thin film transistors or oxide thin film transistors, a gate line driving circuit can also be directly integrated on a thin film transistor array substrate to form a GOA (Gate driver On Array) to drive the gate lines.

A touch screen can be divided into two categories according to different structures: one of the two categories is an external touch screen; and the other of the two categories is an integrated touch screen. The integrated touch screen includes an on-cell touch screen and an in-cell touch screen. The in-cell touch screen can be widely used because the overall thickness of the in-cell touch screen and the manufacturing cost of the in-cell touch screen can be reduced.

SUMMARY

At least one embodiment of the present disclosure provides a shift register unit, comprising: an input circuit, the input circuit being connected to an input terminal and a first node, and being configured to control a level of the first node in response to an input pulse received at the input terminal; a first control circuit, the first control circuit being connected to the input terminal, a first scan voltage terminal, a touch enable signal terminal, and the first node, and being configured to, under control of the input pulse received at the input terminal and a touch enable signal received at the touch enable signal terminal, connect the first scan voltage terminal to the first node to control the level of the first node; and an output circuit, the output circuit being connected to the first node, a clock terminal, and an output terminal, and being configured to connect the clock terminal to the output terminal in response to a potential of the first node, to output a clock signal received by the clock terminal at the output terminal.

For example, in the shift register unit provided by at least one embodiment of the present disclosure, the first control circuit is further connected to the clock terminal to receive the clock signal, and is configured to, under control of the input pulse received at the input terminal, the clock signal received at the clock terminal, and the touch enable signal received at the touch enable signal terminal, disconnect the first scan voltage terminal from the first node to control the level of the first node.

For example, the shift register unit provided by at least one embodiment of the present disclosure further comprises a reset circuit, and the reset circuit is connected to a reset terminal and the first node, and is configured to reset the first node under control of a reset pulse received by the reset terminal.

For example, in the shift register unit provided by at least one embodiment of the present disclosure, the input circuit comprises a first transistor, a gate electrode of the first transistor is connected to the input terminal to receive the input pulse, and a first electrode of the first transistor is connected to the first scan voltage terminal to receive a first scan voltage, and a second electrode of the first transistor is connected to the first node.

For example, in the shift register unit provided by at least one embodiment of the present disclosure, the reset circuit comprises a second transistor, a gate electrode of the second transistor is connected to the reset terminal to receive the reset pulse, a first electrode of the second transistor is connected to the first node, and a second electrode of the second transistor is connected to a second scan voltage terminal to receive a second scan voltage.

For example, in the shift register unit provided by at least one embodiment of the present disclosure, the output circuit comprises a third transistor, a gate electrode of the third transistor being connected to the first node, a first electrode of the third transistor being connected to the clock terminal to receive the clock signal, and a second electrode of the third transistor being connected to the output terminal; and a first capacitor, a first electrode of the first capacitor being connected to the first node, and a second electrode of the first capacitor being connected to the output terminal.

For example, in the shift register unit provided by at least one embodiment of the present disclosure, the first control circuit comprises: a fifth transistor, comprising a first gate electrode and a second gate electrode, the first gate electrode of the fifth transistor being connected to the input terminal to receive the input pulse, the second gate electrode of the fifth transistor being connected to the clock terminal to receive the clock signal, a first electrode of the fifth transistor being connected to the touch enable signal terminal to receive the touch enable signal, and a second electrode of the fifth transistor being connected to a second node; a sixth transistor, a gate electrode of the sixth transistor being connected to the second node, a first electrode of the sixth transistor being connected to the first scan voltage terminal to receive a first scan voltage, and a second electrode of the sixth transistor being connected to the first node; a second capacitor, a first electrode of the second capacitor being connected to the first node, and a second electrode of the second capacitor being grounded; or, the first control circuit comprises: a fifth transistor, a gate electrode of the fifth transistor being connected to the input terminal to receive the input pulse, a first electrode of the fifth transistor being connected to the touch enable signal terminal to receive the touch enable signal, and a second electrode of the fifth transistor being connected to a second node; a twelfth transistor, a gate electrode of the twelfth transistor being connected to the clock terminal to receive the clock signal, a first electrode of the twelfth transistor being connected to the touch enable signal terminal to receive the touch enable signal, and a second electrode of the twelfth transistor being connected to the second node; a sixth transistor, a gate electrode of the sixth transistor being connected to the second node, a first electrode of the sixth transistor being connected to the first scan voltage terminal to receive a first scan voltage, and a second electrode of the sixth transistor being connected to the first node; and a second capacitor, a first electrode of the second capacitor being connected to the first node, and a second electrode of the second capacitor being grounded.

For example, the shift register unit provided by at least one embodiment of the present disclosure further comprises a second control circuit, the second control circuit is connected to the first node, a third node, and a fourth node, and is configured to control a level of the third node in response to the level of the first node and a level of the fourth node.

For example, the shift register unit provided by at least one embodiment of the present disclosure further comprises a first node noise reduction circuit, the first node noise reduction circuit is connected to the first node and the third node, and is configured to perform noise reduction on the first node in response to the level of the third node.

For example, the shift register unit provided by at least one embodiment of the present disclosure further comprises an output noise reduction circuit, the output noise reduction circuit is connected to the reset terminal and the output terminal, and is configured to perform noise reduction on the output terminal under control of the reset pulse received by the reset terminal; or the output noise reduction circuit is connected to the third node and the output terminal, and is configured to perform noise reduction on the output terminal under control of the level of the third node.

For example, in the shift register unit provided by at least one embodiment of the present disclosure, the output noise reduction circuit comprises a fourth transistor, a gate electrode of the fourth transistor is connected to the reset terminal or the third node, a first electrode of the fourth transistor is connected to the output terminal, and a second electrode of the fourth transistor is connected to a second reference voltage terminal to receive a second reference voltage.

For example, in the shift register unit provided by at least one embodiment of the present disclosure, the second control circuit comprises: a seventh transistor, both a gate electrode and a first electrode of the seventh transistor being connected to a reference voltage terminal to receive a first reference voltage, and a second electrode of the seventh transistor being connected to the fourth node; an eighth transistor, a gate electrode of the eighth transistor being connected to the first node, a first electrode of the eighth transistor being connected to the fourth node, and a second electrode of the eighth transistor being connected to a second reference voltage terminal to receive a second reference voltage; a tenth transistor, a gate electrode of the tenth transistor being connected to the fourth node, a first electrode of the tenth transistor being connected to the first reference voltage terminal to receive the first reference voltage, and a second electrode of the tenth transistor being connected to the third node; and an eleventh transistor, a gate electrode of the eleventh transistor being connected to the first node, a first electrode of the eleventh transistor being connected to the third node, and a second electrode of the eleventh transistor being connected to the second reference voltage terminal to receive the second reference voltage.

For example, in the shift register unit provided by at least one embodiment of the present disclosure, the first node noise reduction circuit comprises a ninth transistor, a gate electrode of the ninth transistor is connected to the third node, a first electrode of the ninth transistor is connected to the first node, and a second electrode of the ninth transistor is connected to a second reference voltage terminal to receive a second reference voltage.

At least one embodiment of the present disclosure further comprises a gate driver, comprising N shift register units, which are cascaded, according to any one of the embodiments of the present disclosure, an output terminal of an (m)-th shift register unit in the N shift register units is connected to an input terminal of an (m+1)-th shift register unit in the N shift register units, an output terminal of an (n)-th shift register unit in the N shift register units is connected to a reset terminal of an (n−1)-th shift register unit in the N shift register units, N is an integer greater than or equal to 2, m is an integer and $1 \leq m < N$, and n is an integer and $1 < n \leq N$.

At least one embodiment of the present disclosure further comprises a touch display panel, comprising: a first scan voltage line, configured to transmit a first scan voltage; a second scan voltage line, configured to transmit a second scan voltage; a touch enable signal line, configured to transmit a touch enable signal; a first clock line, configured to transmit a first clock signal; a second clock line, configured to transmit a second clock signal, wherein a phase of the first clock signal and a phase of the second clock signal are opposite; and the gate driver according to any one embodiment of the present disclosure, respective first scan voltage terminals of the N shift register units are connected to the first scan voltage line to receive the first scan voltage, respective second scan voltage terminals of the N shift register units are connected to the second scan voltage line to receive the second scan voltage, respective touch enable signal terminals of the N shift register units are connected to the touch enable signal line to receive the touch enable signal, a clock terminal of a (2k−1)-th shift register unit in the N shift register units is connected to the first clock line to receive the first clock signal, and a clock terminal of a (2k)-th shift register unit in the N shift register units is connected to the second clock line to receive the second clock signal line, k is a positive integer and $2k \leq N$.

At least one embodiment of the present disclosure further comprises a touch display device, comprising the touch display panel according to any one embodiment of the present disclosure.

For example, the touch display device provided by at least one embodiment of the present disclosure further comprises: a timing controller, configured to control an operation of the touch display panel, the timing controller being configured to: provide the first clock signal and the second clock signal to the first clock line and the second clock line, respectively; and provide the touch enable signal to the touch enable signal line, during a period in the case where the touch enable signal is valid, the first clock signal and the second clock signal being invalid; a touch driver, configured to generate a touch scan signal in response to the touch enable signal; and a voltage generator, configured to at least provide the first scan voltage and the second scan voltage to the first scan voltage line and the second scan voltage line, respectively.

At least one embodiment of the present disclosure further provides a driving method for driving the shift register unit provided by any one embodiment of the present disclosure, and the driving method comprises: by the input circuit, controlling the level of the first node in response to the input pulse received at the input terminal; under control of the input pulse received at the input terminal and the touch enable signal received at the touch enable signal terminal, by the first control circuit, connecting the first scan voltage terminal to the first node to control the level of the first node;

and in response to the potential of the first node, by the output circuit, connecting the clock terminal to the output terminal to output the clock signal received by the clock terminal at the output terminal.

For example, the driving method provided by at least one embodiment of the present disclosure further comprises: under control of the input pulse received at the input terminal, the clock signal received at the clock terminal, and the touch enable signal received at the touch enable signal terminal, by the first control circuit, disconnecting the first scan voltage terminal from the first node to control the level of the first node.

For example, in the driving method provided by at least one embodiment of the present disclosure, the clock signal has a duty cycle of 50%, the input pulse has a pulse width, which is equal to half of a period of the clock signal, and is synchronized with a duration of an invalid potential of the clock signal, and the reset pulse has a pulse width, which is equal to half of the period of the clock signal, and is delayed by half of the period of the clock signal relative to the output pulse of the output terminal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
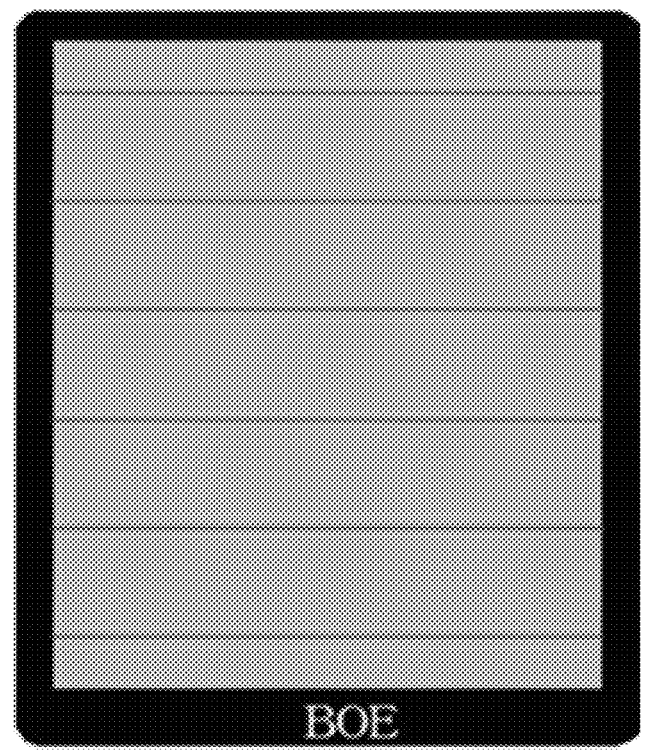
FIG. 1 shows a case in which dark lines on a display are formed in a touch display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be described below through several specific embodiments. In order to keep the following descriptions of the embodiments of the present disclosure clear and concise, detailed descriptions of known functions and known components are omitted. In the case where any component of an embodiment of the present disclosure appears in more than one drawing, the component is denoted by the same reference numeral in each drawing.

For example, a GOA including a plurality of cascaded shift register units may be used to provide switch-state voltage signals for a plurality of rows of gate lines of a pixel array, so as to control, for example, the plurality of rows of gate lines to be sequentially turned on, and at the same time, data lines provide data signals to a corresponding row of pixel units in the pixel array to form gray voltages required for respective gray levels of the display image in the respective pixel units, thereby displaying a frame image.

In a touch display panel, a gate driver including a plurality of cascaded shift register units is generally used to generate a gate driving signal and supply the gate driving signal to a pixel array of the display panel. When the touch display panel enters a touch time period from a display time period and then returns from the touch time period to the display time period, due to a leakage current of the transistor in the gate driver, a waveform of the gate drive signal that is generated is severely deformed, resulting in that the transistor is insufficiently turned on and pixels are charged insufficiently, thereby forming dark lines on the display.

FIG. 1 shows a case in which dark lines on a display are formed in a touch display panel. As shown in FIG. 1, the touch display panel, which is used for displaying, works, for example, in a column inversion mode, in a case of Real 120 Hz reporting rate with long line blanking mode and multiplexer of 3 to 1 (MUX3:1), it is necessary to switch to a touch scan phase 6 times in the process of completing the display of one frame image, and therefore, 6 dark horizontal lines are formed in the touch display panel.

Figure 2:
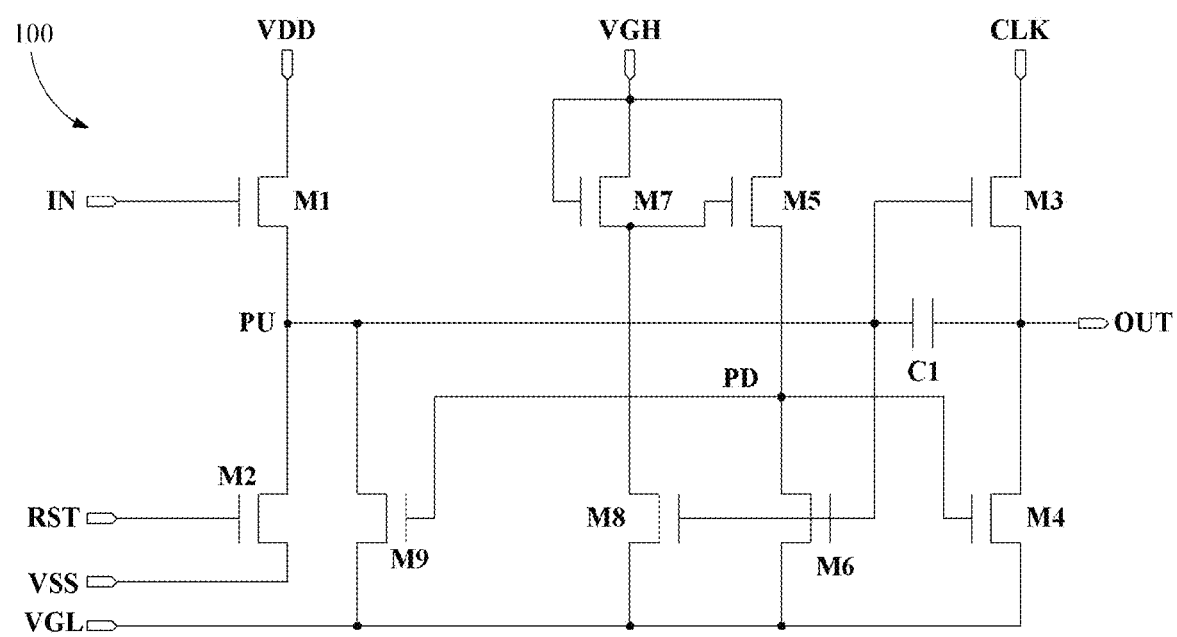
FIG. 2 is a circuit diagram of a typical shift register unit.
Figure 3:
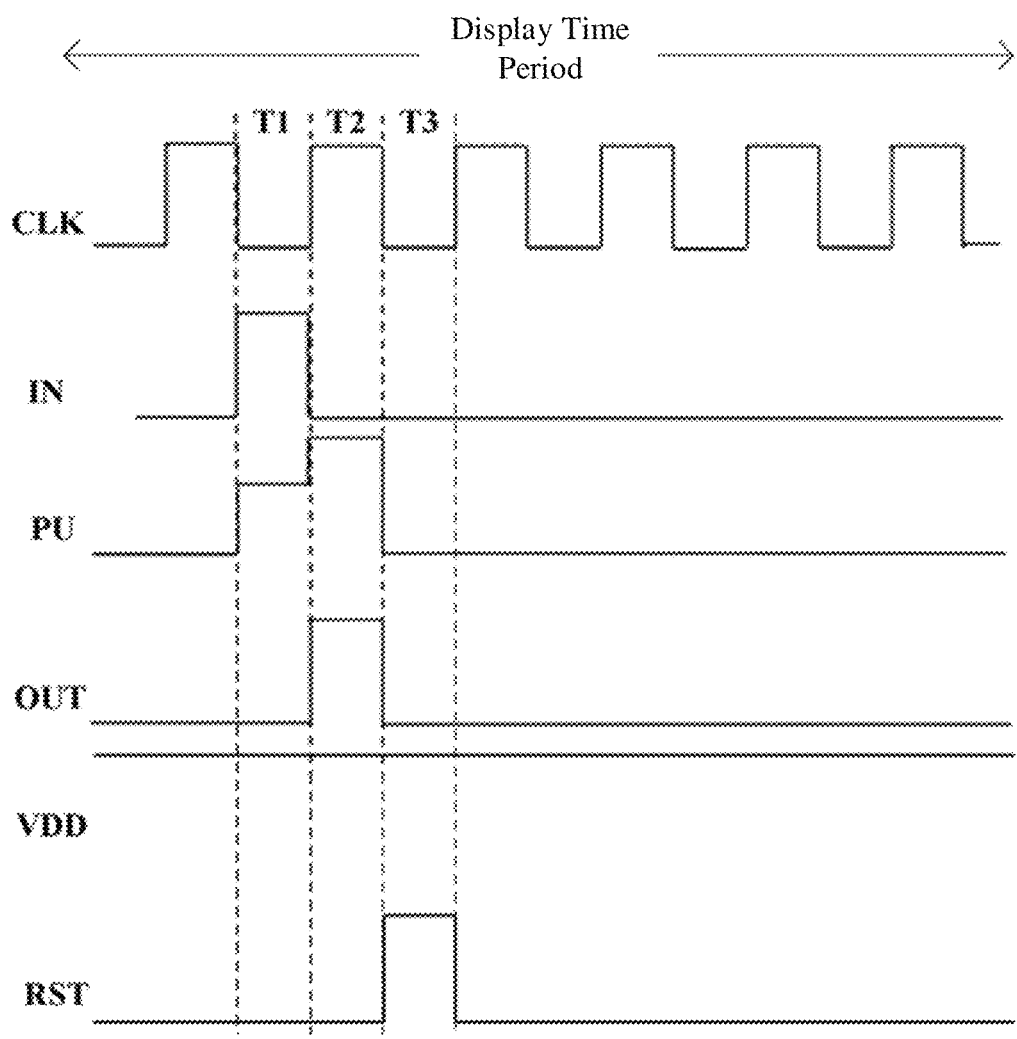
FIG. 3 is a timing diagram of an operation of the shift register unit of FIG. 2 during a display time period.
Figure 4:
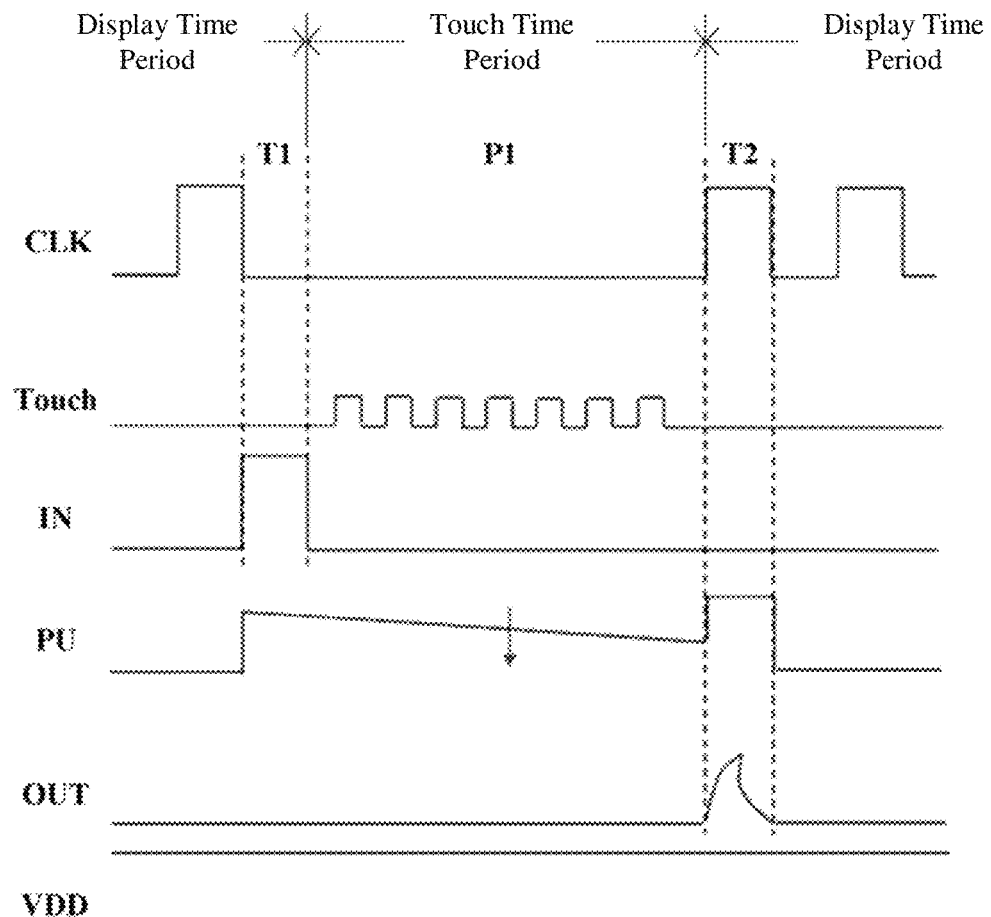
FIG. 4 is a timing diagram of an operation of the shift register unit of FIG. 2 during a touch time period.

The reason for forming the dark lines will be further described in detail in conjunction with FIGS. 2, 3, and 4.

FIG. 2 is a circuit diagram of a typical shift register unit 100. As shown in FIG. 2, the shift register unit 100 includes transistors M1-M9, internal nodes PU and PD, and a capacitor C1. The shift register unit 100 is connected to an input terminal IN, a reset terminal RST, a first scan voltage terminal VDD, a second scan voltage terminal VSS, a first reference voltage terminal VGH, a second reference voltage terminal VGL, a clock terminal CLK, and an output terminal OUT.

FIGS. 3 and 4 respectively show exemplary timing diagrams of the shift register unit 100 of FIG. 2 operating in the display time period and the touch time period. As shown in FIG. 3, the shift register unit 100 works at the display time period at this time. During a time period T1, the input terminal IN provides a high level, and the clock terminal CLK and the reset terminal RST both provide a low level, so the transistor M1 is turned on to connect the first scan voltage terminal VDD to the node PU, so that a high level voltage from the first scan voltage terminal VDD is supplied to the node PU. The node PU is at a high level and then turns on the transistor M3, so that the output terminal OUT is connected to the clock terminal CLK. Because the clock terminal CLK provides a low level at this time, the output terminal OUT outputs a low level. In a time period T2 immediately after the time period T1, although the input terminal IN is at a low level, the node PU is still at a high level, and keeps the transistor M3 to be turned on, and a potential of the clock terminal CLK changes from low to high, so that the output signal of the output terminal OUT changes from a low level to a high level. In particular, due to a bootstrap effect of the capacitor C1, a potential at the node PU changes synchronously with the change of the potential at the output terminal OUT, which enables the transistor M3 to be further turned on to ensure a quality of an output pulse of the output terminal OUT, as shown in FIG. 3. In a time period T3 immediately after the time period T2, the reset terminal RST becomes a high level, so that the transistor M2 is turned on to connect the second scan voltage terminal VSS to the node PU, so that a low level voltage from the second scan voltage terminal VSS is supplied to the node PU, thereby turning off the transistors M3, M6, and M8. The transistors M6 and M8 are turned off, so as to cause the transistor M5 to be turned on to connect the first reference voltage terminal VGH to the node PD, and therefore, a high level voltage from the first reference voltage terminal VGH is supplied to the node PD. The high level of the node PD enables the transistor M4 be turned on, so that the second reference voltage terminal VGL is connected to the output terminal OUT.

As shown in FIG. 4, the shift register unit 100 will switch to the touch time period to operate. During the time period T1, the input terminal IN provides a high level, so the transistor M1 is turned on to connect the first scan voltage terminal VDD to the node PU, and therefore, the high level voltage from the first scan voltage terminal VDD is supplied to the node PU. The node PU is at a high level to turn on the transistor M3, so that the output terminal OUT is connected to the clock terminal CLK. However, because the clock terminal CLK provides a low level, the output terminal OUT outputs a low level. In a time period P1 immediately after the time period T1, the touch display panel switches to a touch mode, and the clock terminal CLK maintains to input a low level during the period when the touch scan signal Touch is valid. Because the thin film transistors have the leakage current characteristics, and an amount of leakage will increase with time, the potential of the node PU will decrease due to the leakage of the transistors M2, M6, and M9 during the touch time period, as shown in FIG. 4. In the case where the touch scan signal Touch becomes invalid, so that the touch time period ends, in the time period T2 immediately after the time period P1, the potential of the clock terminal CLK changes from low to high. At this time, because the potential of the node PU is lower than the potential of the node PU when the current at the node PU is not leaking, the transistor M3 is turned on insufficiently, which causes the output pulse of the output terminal OUT to be severely deformed, which in turn causes the thin film transistors in the corresponding row to be turned on insufficiently, so that the pixels are charged insufficient, thereby displaying the dark lines.

At least one embodiment of the present disclosure provides a shift register unit, and the shift register unit comprises an input circuit, the input circuit being connected to an input terminal and a first node, and being configured to control a level of the first node in response to an input pulse received at the input terminal; a first control circuit, the first control circuit being connected to the input terminal, a first scan voltage terminal, a touch enable signal terminal, and the first node, and being configured to, under control of the input pulse received at the input terminal and a touch enable signal received at the touch enable signal terminal, connect the first scan voltage terminal to the first node to control the level of the first node; and an output circuit, the output circuit being connected to the first node, a clock terminal, and an output terminal, and being configured to connect the clock terminal to the output terminal in response to a potential of the first node, to output a clock signal received by the clock terminal at the output terminal.

In the shift register unit provided by the embodiment of the present disclosure, the first control circuit keeps supplying the first scan voltage to the first node when the touch enable signal is valid, and therefore, during the touch time period, the potential at the first node will not be reduced due to the leakage of the transistor, thereby ensuring that the transistor in the output circuit can still be fully turned on after the touch time period ends, thereby ensuring the quality of the output pulse of the output terminal, which in turn enables the thin film transistors in the corresponding row to be fully turned on, ensures the charging for the pixels, and avoids the dark lines.

The embodiments and examples of the present disclosure will be described in detail below with reference to the drawings.

Figure 5:
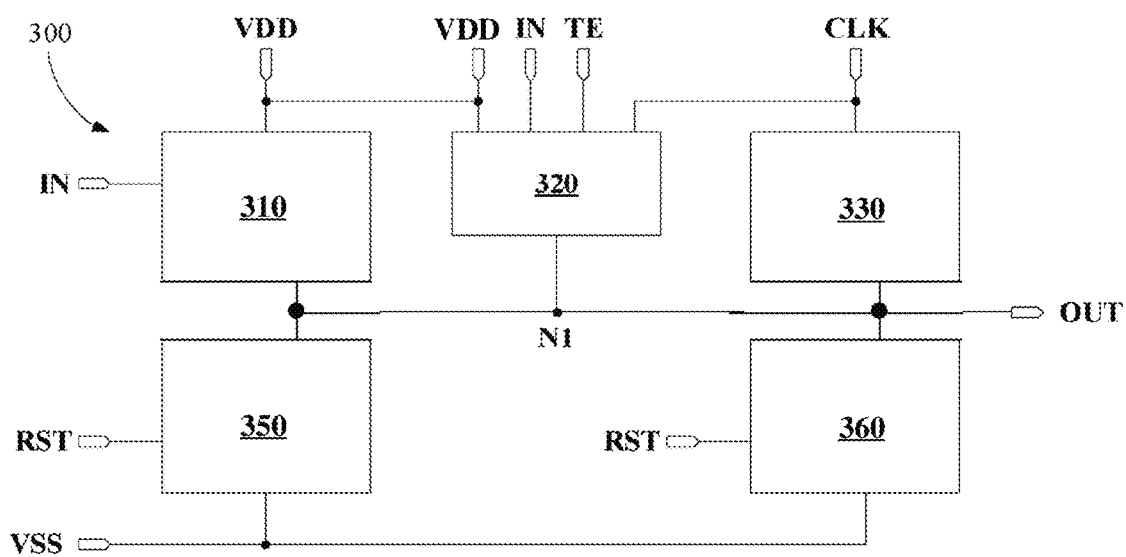
FIG. 5 is a schematic block diagram of a shift register unit according to at least one embodiment of the present disclosure.

FIG. 5 is a schematic block diagram of a shift register unit 300 according to at least one embodiment of the present disclosure. Referring to FIG. 5, the shift register unit 300 comprises an input terminal IN capable of receiving an input pulse, a reset terminal RST capable of receiving a reset pulse, a first scan voltage terminal VDD, to which a first scan voltage (e.g., high level) can be applied, a second scan voltage terminal VSS, to which a second scan voltage (e.g., low level, lower than the first scan voltage) can be applied, a clock terminal CLK capable of receiving a clock signal, a touch enable signal terminal TE, to which a touch enable signal can be applied, and an output terminal OUT that can be used to output an output signal. The shift register unit 300 also includes an input circuit 310, a first control circuit 320, and an output circuit 330, which are illustrated as blocks.

For example, the input circuit 310 is connected to the input terminal IN and a first node N1 (pull-up node), and is configured to control a level of the first node N1 in response to an input pulse received at the input terminal IN. For example, in some examples, the input circuit 310 is configured to be turned on in response to a valid potential of the input pulse received at the input terminal IN, so that the first scan voltage terminal VDD or a separately provided voltage terminal (for example, providing a high level) is connected to the first node N1 to supply the first scan voltage to the first node N1. For example, in other examples, the input circuit 310 may be further configured to be turned on in response to the valid potential of the input pulse received at the input terminal IN, so that the input terminal IN is connected to the first node N1, thereby supplying the input pulse to the first node N1 to charge the first node, and therefore, the level of the first node is pulled up.

For example, the first control circuit 320 is connected to the input terminal IN, the first scan voltage terminal VDD, the touch enable signal terminal TE, and the first node N1, and is configured to, under control of the input pulse received at the input terminal IN and a touch enable signal received at the touch enable signal terminal TE, enable the first scan voltage terminal VDD or a separately provided voltage terminal (for example, providing a high level) to be connected to the first node N1 to control the level of the first node N1. For example, in some examples, the first control circuit 320 is turned on in response to the valid potential of the input pulse received at the input terminal IN and a valid potential of the touch enable signal received at the touch enable signal terminal TE, enable the first scan voltage terminal VDD to be connected to the first node N1, and maintains a connection between the first scan voltage terminal VDD and the first node N1 during the period when the touch enable signal is valid, so as to supply the first scan voltage to the first node N1.

For example, in other examples, the first control circuit 320 is also connected to the clock terminal CLK to receive a clock signal, and is configured to, under control of the input pulse received at the input terminal INT, the clock signal received at the clock terminal CLK, and the touch enable signal received at the touch enable signal terminal TE, enable the first scan voltage terminal VDD to be disconnected from the first node N1 to control the level of the first node N1. For example, in some examples, the first control circuit 320 is turned on in response to the valid potential of the clock signal received at the clock terminal CLK, and is turned off under the control of the invalid potential of the touch enable signal received at the touch enable signal terminal TE, so that the first scan voltage terminal VDD is disconnected from the first node N1.

For example, the output circuit 330 is connected to the first node N1, the clock terminal CLK, and the output terminal OUT, and is configured to connect the clock terminal CLK to the output terminal OUT in response to the potential of the first node N1, so as to output the clock signal received by the clock terminal CLK at the output terminal OUT. For example, the output circuit 330 is turned on in response to the valid potential of the first node N1, thereby connecting the clock terminal CLK to the output terminal OUT to output the clock signal received by the clock terminal CLK to the output terminal OUT.

For example, in some other examples, as shown in FIG. 5, the shift register unit 300 further includes a reset circuit 350 and an output noise reduction circuit 360.

For example, the reset circuit 350 is connected to a reset terminal RST and the first node N1, and is configured to reset the first node N1 under control of a reset pulse received by the reset terminal RST. For example, in some examples, the reset circuit 350 is turned on in response to a valid potential of the reset pulse of the reset terminal RST, so that the first node N1 is connected to the second scan voltage terminal VSS or a separately provided voltage terminal (for example, providing a low level), so that the second scan voltage (for example, a low level that is lower than a high level) or the low level provided by the separately provided voltage terminal can be used to reset the first node N1, so that the output pulse is at an invalid potential.

For example, in the example shown in FIG. 5, the output noise reduction circuit 360 is connected to the reset terminal RST and the output terminal OUT, and is configured to perform noise reduction on the output terminal OUT under the control of the reset pulse received by the reset terminal RST. For example, the output noise reduction circuit 360 is turned on in response to the valid potential of the reset pulse of the reset terminal RST, and enable the output terminal OUT to be connected to the second scan voltage terminal VSS or a separately provided voltage terminal (e.g., providing a low level), and therefore, the second scan voltage or a low level provided by the separately provided voltage terminal can be used to reset the output terminal OUT, so that the output pulse is at an invalid potential to ensure the display quality of the display panel.

It should be noted that the term "valid potential" used in the present disclosure refers to a potential required to turn on the involved circuit element (e.g., transistor), and the term "invalid potential" used in the present disclosure refers to a potential at which the involved circuit element is turned off. For an n-type transistor, the valid potential is a high potential, and the invalid potential is a low potential. For a p-type transistor, the valid potential is a low potential, and the invalid potential is a high potential. It should be understood that the valid potential or the invalid potential is not intended to refer to a specific potential, but may include a range of potential. In addition, the term "voltage level" may be used interchangeably with "potential".

It is easy to understand that in the embodiment, the first control circuit 320 keeps supplying the first scan voltage to the first node N1 during the period when the touch enable signal is valid, so that the potential at the first node N1 will not be reduced due to the leakage of the transistor during the touch time period, thereby ensuring that the transistor in the output circuit 330 can still be fully turned on after the touch time period ends, thus ensuring the quality of the output pulse at the output terminal, which in turn enables the thin film transistors in the corresponding row to be fully turned on, ensures the charging for the pixels, and avoid dark lines.

Figure 6A:
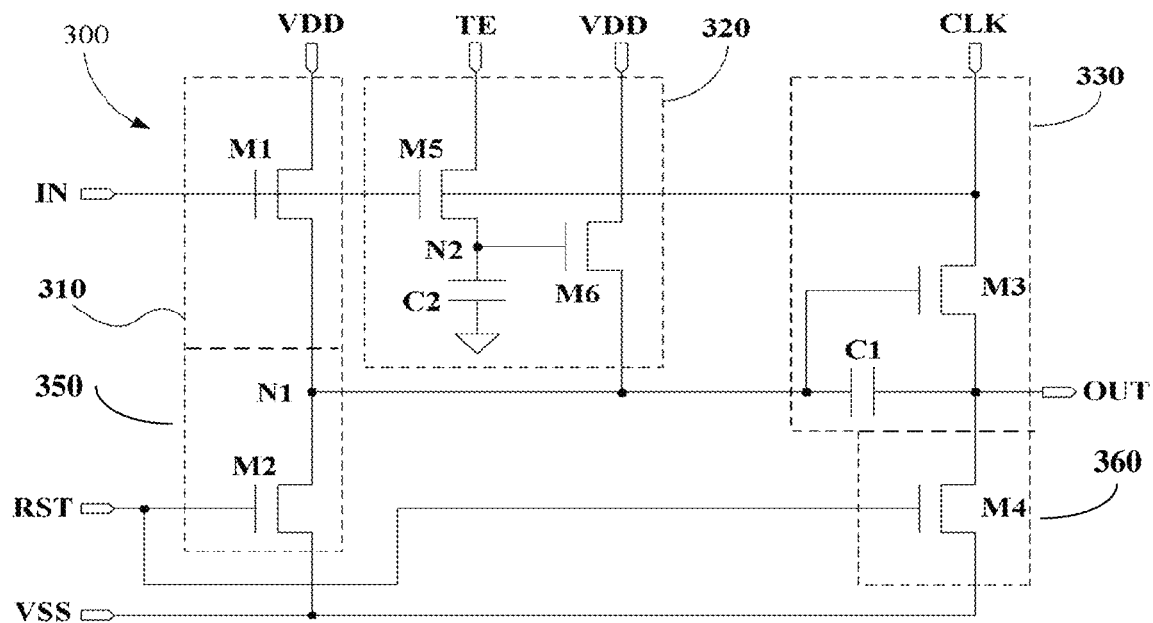
FIG. 6A is a circuit diagram of an exemplary circuit of the shift register unit of FIG. 5.

FIG. 6A is a circuit diagram of a specific implementation example of the shift register unit 300 of FIG. 5. The exemplary configuration of the shift register unit 300 is described below with reference to FIG. 6A. As shown in FIG. 6A, the shift register unit 300 includes: a first transistor M1 to a sixth transistor M6, a first capacitor C1, and a second capacitor C2. It should be noted that the transistors as shown in FIG. 6A are all described by taking n-type transistors as an example, and the embodiments of the present disclosure are not limited to this case. For example, at least part of the transistors in the shift register unit 300 may also be p-type transistors.

For example, as shown in FIG. 6A, the input circuit 310 includes a first transistor M1. The first transistor M1 includes a gate electrode connected to the input terminal IN, a first electrode connected to the first scan voltage terminal VDD to receive the first scan voltage, and a second electrode connected to the first node N1. For example, in other examples, the gate electrode and the first electrode of the first transistor M1 may both be connected to the input terminal INT, so as to achieve to charge the first node N1, the embodiments of the present disclosure are not limited in this aspect.

The reset circuit 350 includes a second transistor M2. The second transistor M2 includes a gate electrode connected to the reset terminal RST to receive the reset pulse, a first electrode connected to the first node N1, and a second electrode connected to the second scan voltage terminal VSS to receive the second scan voltage.

The first control circuit 320 comprises a fifth transistor M5, a sixth transistor M6, and a second capacitor C2. A first electrode of the fifth transistor M5 is connected to the touch enable signal terminal TE to receive the touch enable signal, a second electrode of the fifth transistor M5 is connected to a second node N2, and a gate electrode of the fifth transistor M5 is connected to the input terminal IN and the clock terminal CLK, however, the input terminal IN and the clock terminal CLK are not connected to each other, in such a way that when the input terminal IN and the clock terminal CLK do not simultaneously provide a valid potential, the fifth transistor M5 will be turned on in the case where at least one of the input terminal IN and the clock terminal CLK is at a valid potential. In some embodiments, the fifth transistor M5 has a first gate electrode and a second gate electrode, the first gate electrode is connected to the input terminal IN to receive the input pulse, and the second gate electrode is connected to the clock terminal CLK to receive the clock signal, and therefore, when the input terminal IN and the clock terminal CLK are not valid at the same time, the fifth transistor M5 will be turned on when at least one of the input terminal IN and the clock terminal CLK is at a valid potential. The sixth transistor M6 has a gate electrode connected to the second node N2, a first electrode connected to the first scan voltage terminal VDD to receive the first scan voltage, and a second electrode connected to the first node N1. The second capacitor C2 is connected between the second node N2 and the ground. For example, a first electrode of the second capacitor C2 is connected to the first node N1, and a second electrode of the second capacitor C2 is grounded.

Figure 6B:
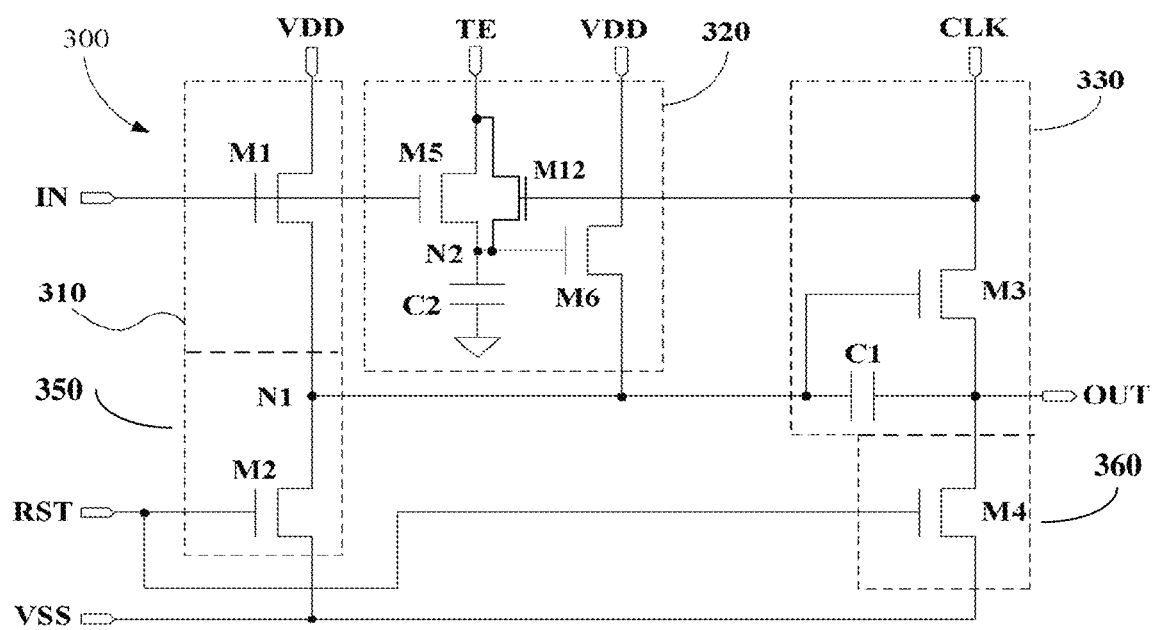
FIG. 6B is a circuit diagram of another exemplary circuit of the shift register unit of FIG. 5.

For example, in the example shown in FIG. 6B, the first control circuit includes: a fifth transistor M5, a sixth transistor M6, a twelfth transistor M12, and a second capacitor C2. The first electrode of the fifth transistor M5 is connected to the touch enable signal terminal TE to receive the touch enable signal, the second electrode of the fifth transistor M5 is connected to the second node N2, and the gate electrode of the fifth transistor M5 is connected to the input terminal IN to receive the input pulse. The gate electrode of the twelfth transistor M12 is connected to the clock terminal CLK to receive the clock signal, the first electrode of the twelfth transistor M12 is connected to the touch enable signal terminal TE to receive the touch enable signal, the second electrode of the twelfth transistor M12 is connected to the second node N2. For example, the fifth transistor M5 controls the charging of the second node N2, and the twelfth transistor M12 controls the discharging of the second node N2. The sixth transistor M6 has a gate electrode connected to the second node N2, a first electrode connected to the first scan voltage terminal VDD to receive the first scan voltage, and a second electrode connected to the first node N1. The second capacitor C2 is connected between the second node N2 and the ground. For example, the first electrode of the second capacitor C2 is connected to the first node N1, and the second electrode of the second capacitor C2 is grounded.

It should be noted that the working principle of the twelfth transistor M12 is similar to the working principle of the fifth transistor M5, and will not be repeated here again. The following is introduced by taking a case that the fifth transistor comprises the first gate electrode and the second gate electrode as an example, and the embodiments of the present disclosure are not limited thereto.

The output circuit 330 includes a third transistor M3. The third transistor M3 has a gate electrode connected to the first node N1, a first electrode connected to the clock terminal CLK to receive the clock signal, and a second electrode connected to the output terminal OUT. The output circuit 330 also optionally includes a first capacitor C1 connected between the first node N1 and the output terminal OUT. For example, a first electrode of the first capacitor C1 is connected to the first node N1, and a second electrode of the first capacitor C1 is connected to the output terminal OUT. The presence of the first capacitor C1 is advantageous, because the potential at the first node N1 can be further increased due to the bootstrap effect of the first capacitor C1, so as to further turn on the third transistor M3, which will be described later.

For example, the output noise reduction circuit 360 includes a fourth transistor M4. The fourth transistor M4 has a gate electrode connected to the reset terminal RST to receive the reset pulse, a first electrode connected to the output terminal OUT, and a second electrode connected to the second scan voltage terminal VSS to receive the second scan voltage.

Figure 7:
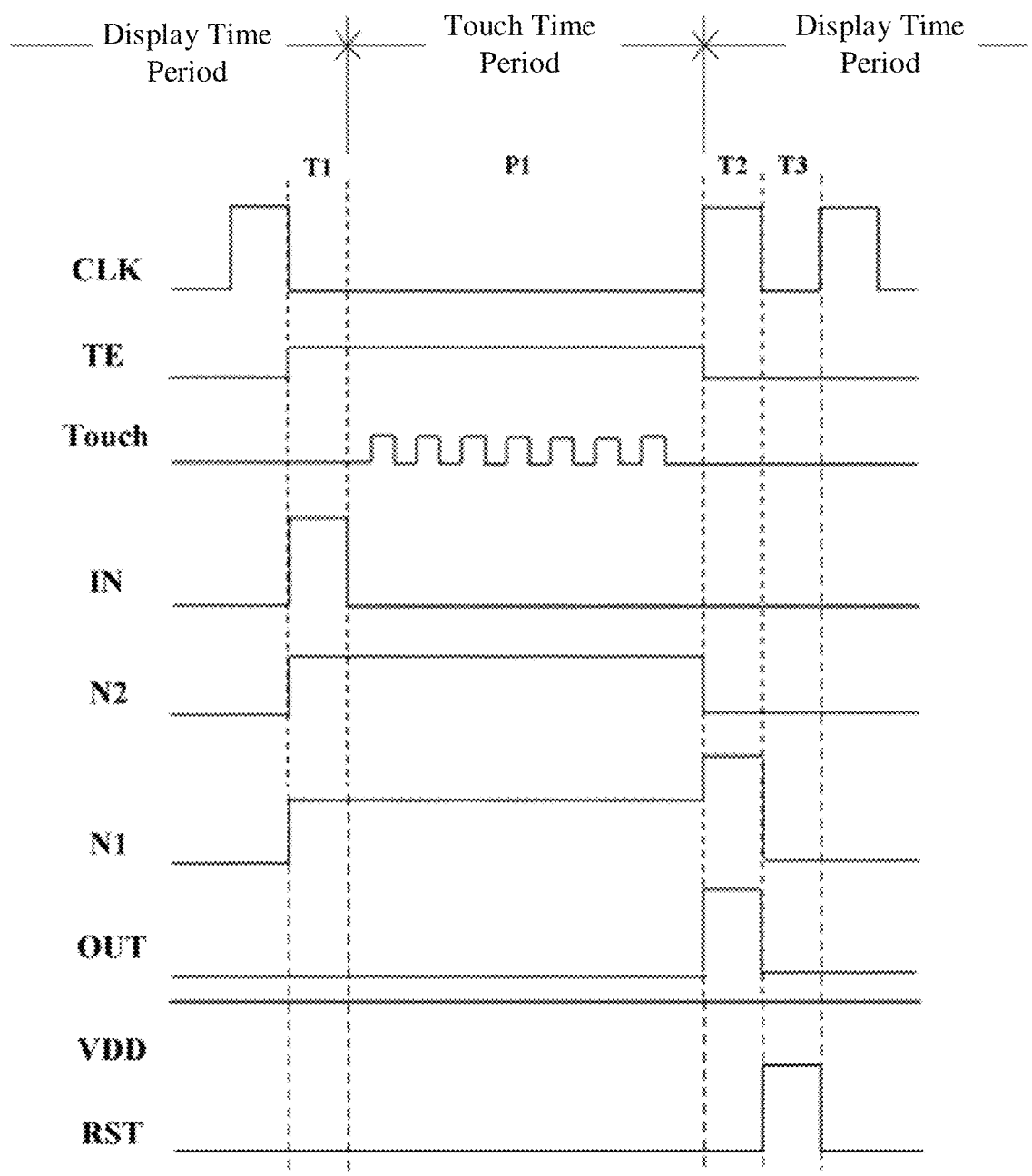
FIG. 7 is an exemplary timing diagram for the exemplary circuit of the shift register unit of FIG. 6A.

FIG. 7 is an exemplary timing diagram for the shift register unit shown in FIG. 6A. For the convenience of illustration, only one touch time period is shown in FIG. 7. In FIG. 7, the clock signal received at the clock terminal CLK is shown to have a 50% duty cycle, and the input pulse received at the input terminal IN is shown to have a pulse width equal to half of a period of the clock signal and synchronized with a duration of the invalid potential of the clock signal. The reset pulse received at the reset terminal RST has a pulse width, which is equal to half of the period of the clock signal, and is delayed by half of the period of the clock signal relative to the output pulse of the output terminal OUT. In addition, it is also assumed in this example that the first scan voltage terminal VDD and the second scan voltage terminal VSS are applied with a high level and a low level, respectively.

The working principle of the exemplary circuit 300 shown in FIG. 6A is described below with reference to FIG. 7. In the embodiments of the present disclosure, 1 indicates a high level, and 0 indicates a low level.

In a time period T1 (a display time period), IN=1, CLK=0, RST=0, TE=1. Because IN=1, the first transistor M1 is turned on to connect the first scan voltage terminal VDD to the first node N1, so that the high level voltage from the first scan voltage terminal VDD is supplied to the first node N1, and therefore, the first node N1 is set to be at a valid potential, and accordingly, the third transistor M3 is turned on. In addition, IN=1 also enables the fifth transistor M5 be turned on, so as to connect the touch enable signal terminal TE to the second node N2, thereby transmitting the high level voltage from the touch enable signal terminal TE to the second node N2, and therefore, the second node N2 is set to be at a valid potential, and at the same time, the second capacitor C2 is charged. The second node N2 is at a valid potential, so that the sixth transistor M6 is turned on to connect the first scan voltage terminal VDD to the first node N1, thereby supplying the high level voltage from the first scan voltage terminal VDD to the first node N1. At this time, because the third transistor M3 is turned on, the output terminal OUT and the clock terminal CLK are connected. Because CLK=0 in this case, the output terminal OUT outputs a low level.

In a time period P1 (a touch time period) after the time period T1, the touch scan signal Touch is a valid potential, and IN=0, CLK=0, RST=0, TE=1. Because IN=0 and RST=0, the first transistor M1 and the second transistor M2 are turned off, and because IN=0 and CLK=0, the fifth transistor M5 is also turned off. However, due to the electricity storage effect of the second capacitor C2, the second node N2 still remains at a valid potential, so that the sixth transistor M6 remains to be turned on, thereby continuing to keep the first scan voltage terminal VDD and the first node N1 to be connected with each other, so that the high level voltage from the first scan voltage terminal VDD is supplied to the first node N1. In this way, the first control circuit 320 can maintain the potential at the first node N1 during the touch time period, thereby ensuring that the transistor M3 in the output circuit 330 can be sufficiently turned on. Because the first node N1 remains at the valid potential, the third transistor M3 remains to be turned on, so that the output terminal OUT and the clock terminal CLK remain connected with each other. Because CLK=0 at this time, the output terminal OUT outputs a low level.

In a time period T2 (a display period) after the end of the time period P2, the touch scan signal Touch becomes an invalid potential, and IN=0, CLK=1, RST=0, TE=0. Because IN=0 and RST=0, the first transistor M1 and the second transistor M2 are turned off. Because IN=0 and CLK=1, the fifth transistor M5 is turned on and supplies the low level voltage from the touch enable signal terminal TE to the second node N2 to set the second node N2 to be at an invalid potential, and at the same time, the second capacitor C2 is discharged. Because the second node N2 is at an invalid potential, the sixth transistor M6 is turned off. At this time, the first node N1 continues to be at a valid potential, so that the third transistor M3 remains to be turned on. In particular, due to the bootstrap effect of the first capacitor C1, the potential at the first node N1 changes synchronously with the change of the potential at the output terminal OUT, as shown in FIG. 7, thereby further turning on the third transistor M3. The turned-on third transistor M3 enables the output terminal OUT be connected to the clock terminal CLK. Because CLK=1 at this time, the output of the output terminal OUT changes from a low level to a high level.

In a time period T3 (a display time period) after the end of the time period T2, IN=0, CLK=0, RST=1, TE=0. Because IN=0, the first transistor M1 is turned off, and because IN=0 and CLK=0, the fifth transistor M5 is turned off. Because the second capacitor C2 has been discharged, the second node N2 is at an invalid potential, so that the sixth transistor M6 is turned off. Because RST=1, the second transistor M2 is turned on to connect the second scan voltage terminal VSS to the first node N1, and therefore, the low level voltage from the second scan voltage terminal VSS is supplied to the first node N1 to enable the first node N1 be at an invalid potential, thereby achieving to reset the first node. Because N1 is at an invalid potential, the third transistor M3 is turned off, so that the output terminal OUT is disconnected from the clock terminal CLK. Because RST=1, the fourth transistor M4 is turned on, so that the output terminal OUT and the second scan voltage terminal VSS are connected with each other, and therefore, the low level of the second scan voltage terminal VSS is supplied to the output terminal OUT, so that the output of the output terminal OUT changes from a high level to a low level, thereby achieving to reset the output terminal OUT.

In this way, the first control circuit 320 can maintain the potential at the first node N1 during the touch time period, thereby ensuring that the transistor M3 in the output circuit 330 can be fully turned on.

Figure 8:
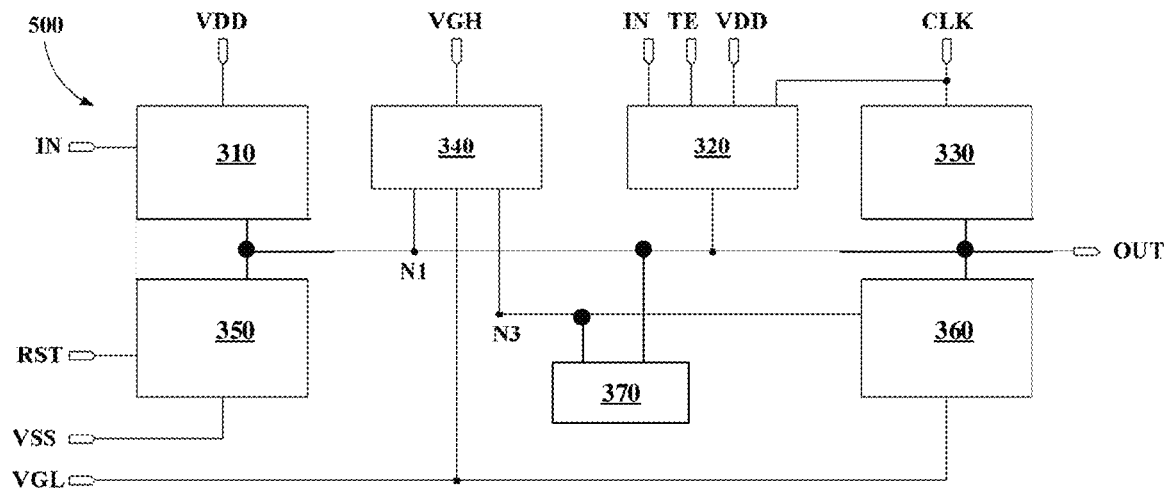
FIG. 8 is a schematic block diagram of another shift register unit according to at least one embodiment of the present disclosure.
Figure 9:
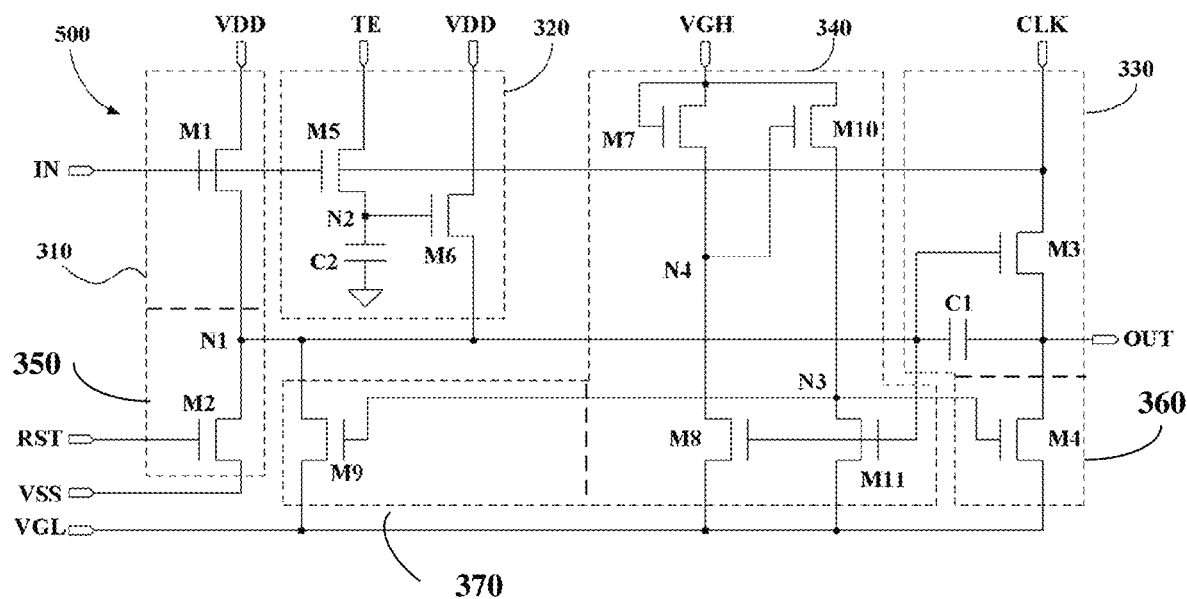
FIG. 9 is a circuit diagram of an exemplary circuit of the shift register unit of FIG. 8.

FIGS. 8 and 9 are a schematic block diagram and an exemplary circuit diagram of a shift register unit 500 according to another embodiment of the present disclosure, respectively. The shift register unit 500 is very similar to the shift register unit 300 shown in FIGS. 5 and 6A, the only difference is that: on the basis of the example as shown in FIG. 5, the shift register unit 500 further includes a first reference voltage terminal VGH, to which a first reference voltage (for example, a high level) can be applied, a second reference voltage terminal VGL, to which a second reference voltage (for example, a low level, which is lower than the first reference voltage) can be applied, a first node noise reduction circuit 370, and a second control circuit 340. Setting the first reference voltage, the second reference voltage, and the second control circuit 340 helps reduce the noise of the shift register unit. It is easily understood that the foregoing description about the shift register unit 300 is also applicable to the same parts and/or elements in the shift register unit 500. For the sake of brevity, only the differences between the shift register unit 500 and the shift register unit 300 will be described below.

Referring to FIG. 8, the shift register unit 500 also includes an input circuit 310, a first control circuit 320, a reset circuit 350, an output noise reduction circuit 360, and an output circuit 330, and further includes a second control circuit 340 and a first node noise reduction circuit 370.

For example, as shown in FIGS. 8 and 9, the second control circuit 340 is connected to the first node N1, a third node N3 (e.g., a pull-down node), and a fourth node N4, and is configured to control a level of the third node N3 in response to the level of the first node N1 and a level of the fourth node N4. For example, in some examples, the second control circuit 340 is turned on in response to the valid potential of the first node N1, so that the second reference voltage terminal VGL is connected to the third node N3; the second control circuit 340 connects the first reference voltage terminal VGH to the third node N3 in response to a valid potential of the first reference voltage applied to the first reference voltage terminal VGH and an invalid potential of the first node N1, thereby achieving to control the level of the third node N3.

The first node noise reduction circuit 370 is connected to the first node N1 and the third node N3, and is configured to perform noise reduction on the first node N1 in response to the level of the third node N3. For example, in some examples, the first node noise reduction circuit 370 is turned on in response to the valid potential of the third node N3, so that the second reference voltage terminal VGL is connected to the first node N1, and therefore, the second reference voltage of the second reference voltage terminal VGL is supplied to the first node N1, thereby achieving to perform noise reduction on the first node N1.

For example, in the example shown in FIG. 8, the output noise reduction circuit 360 is connected to the third node N3 and the output terminal OUT, and is configured to perform noise reduction on the output terminal OUT under the control of the level of the third node N3. For example, the output noise reduction circuit 360 is turned on under the control of the level of the third node N3, so that the output terminal OUT is connected to the second reference voltage terminal VGL to receive the second reference voltage, thereby achieving to perform noise reduction on the output terminal OUT.

Hereinafter, an exemplary circuit of the shift register unit 500 are described with reference to FIG. 9. The shift register unit 500 includes the input circuit 310, the reset circuit 350, the output circuit 330, and the first control circuit 320 that are the same as those in the shift register unit 300, and the similar portions will not be described below.

The second control circuit 340 includes a seventh transistor M7, an eighth transistor M8, a tenth transistor M10, and an eleventh transistor M11. The seventh transistor M7 has a gate electrode and a first electrode that are connected to the first reference voltage terminal VGH to receive the first reference voltage, and a second electrode connected to the fourth node N4. The eighth transistor M8 has a gate electrode connected to the first node N1, a first electrode connected to the fourth node N4, and a second electrode connected to the second reference voltage terminal VGL to receive the second reference voltage. The tenth transistor M10 has a first electrode connected to the first reference voltage terminal VGH to receive the first reference voltage, a second electrode connected to the third node N3, and a gate electrode connected to the fourth node N4. The eleventh transistor M11 has a gate electrode connected to the first node N1, a first electrode connected to the third node N3, and a second electrode connected to the second reference voltage terminal VGL to receive the second reference voltage.

The first node noise reduction circuit 370 includes a ninth transistor M9, and the ninth transistor M9 has a gate electrode connected to the third node N3, a first electrode connected to the first node N1, and a second electrode connected to the second reference voltage terminal VGL to receive the second reference voltage.

For example, in the example shown in FIG. 9, the gate electrode of the fourth transistor M4 included in the output noise reduction circuit may be connected to the third node N3, the first electrode of the fourth transistor M4 is connected to the output terminal OUT, and the second electrode of the fourth transistor M4 is connected to the second reference scan voltage terminal VGL.

Figure 10:
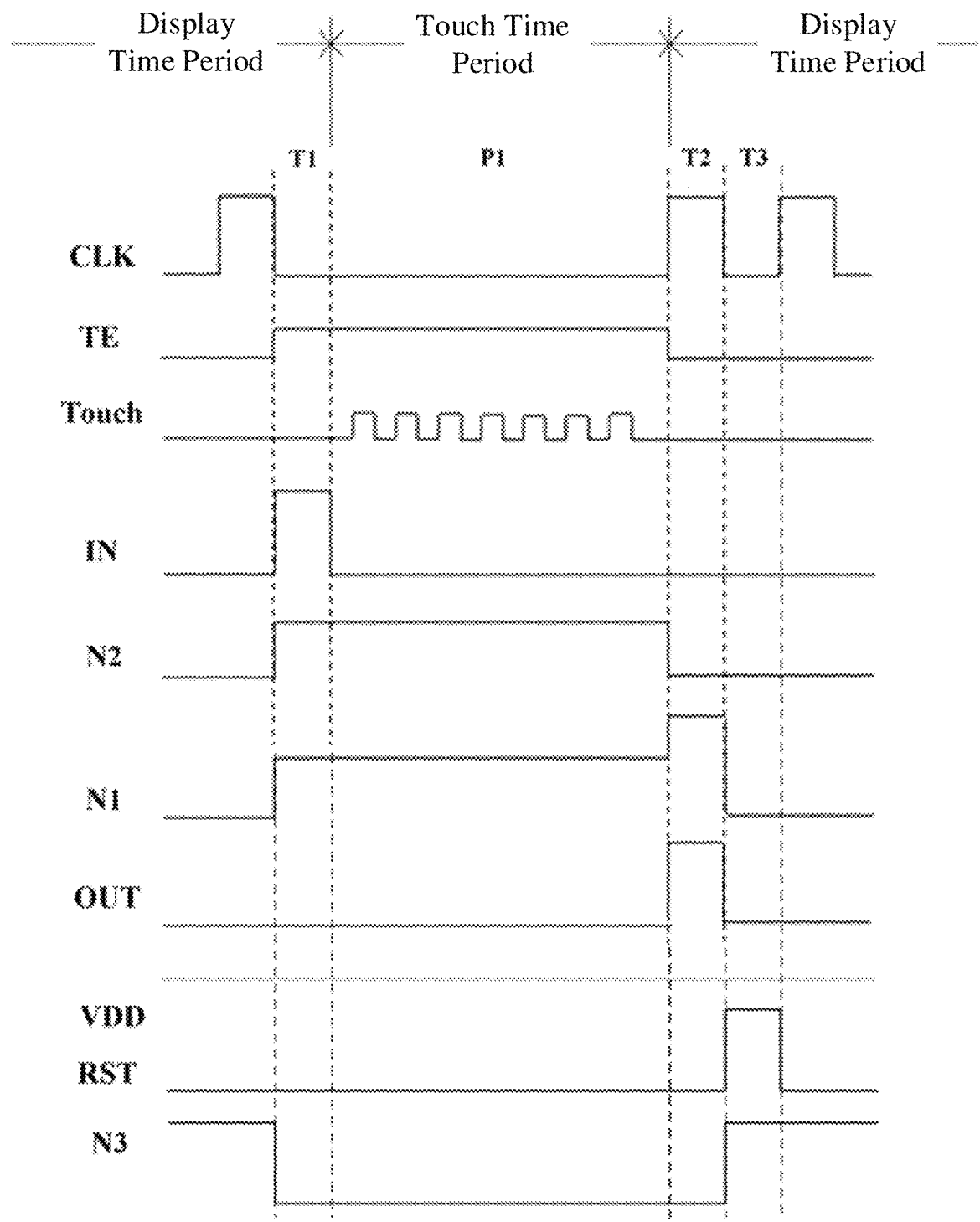
FIG. 10 is an exemplary timing diagram for the exemplary circuit of the shift register unit of FIG. 8.

FIG. 10 is an exemplary timing diagram for the shift register unit 500 of FIG. 8. For the convenience of illustration, only one touch time period is shown in FIG. 10. Similar to FIG. 7, in the example as shown in FIG. 10, the clock signal received at the clock terminal CLK is shown to have a 50% duty cycle, and the input pulse received at the input terminal IN is shown to have a pulse width equal to half of the period of the clock signal and synchronized with the duration of the invalid potential of the clock signal. The reset pulse received at the reset terminal RST has a pulse width, which is equal to half of the period of the clock signal, and is delayed by half of the period of the clock signal relative to the output pulse of the output terminal OUT. In addition, for example, in this example, the first scan voltage terminal VDD and the second scan voltage terminal VSS are applied with a high level and a low level, respectively, and the first reference voltage terminal VGH and the second scan voltage terminal VGL are applied with a high level and a low level, respectively.

The working principle of the exemplary circuit 500 as shown in FIG. 8 is described below with reference to FIG. 10. In the embodiments of the present disclosure, 1 indicates a high level, and 0 indicates a low level.

In a time period T1 (a display time period), IN=1, CLK=0, RST=0, TE=1. Because IN=1, the first transistor M1 is turned on, so that the first scan voltage terminal VDD is connected to the first node N1, so that the high level voltage from the first scan voltage terminal VDD is supplied to the first node N1, and therefore, the first node N1 is set to be at a valid potential, and accordingly, the third transistor M3, the eighth transistor M8, and the eleventh transistor M11 are turned on. In addition, IN=1 also enables the fifth transistor M5 be turned on, so as to connect the touch enable signal terminal TE to the second node N2, thereby transmitting the high level voltage from the touch enable signal terminal TE to the second node N2, and therefore, the second node N2 is set to be at a valid potential, and at the same time, the second capacitor C2 is charged. The second node N2 is at a valid potential, so that the sixth transistor M6 is turned on to connect the first scan voltage terminal VDD to the first node N1, thereby supplying the high level voltage from the first scan voltage terminal VDD to the first node N1. In addition, because the first reference voltage terminal VGH is applied with a high level, the seventh transistor M7 is turned on. The seventh transistor M7 and the eighth transistor M8 are designed with such an aspect ratio (the aspect ratio determines an equivalent turn-on resistance of the transistor), so that the fourth node N4 is connected to the second reference voltage terminal in the case where both the seventh transistor M7 and the eighth transistor M8 are turned on, and therefore, the fourth node N4 is set to be at an invalid potential, thereby turning off the tenth transistor M10. In this case, because the eleventh transistor M11 is turned on, the low level from the second reference voltage terminal VGL is supplied to the third node N3. Because the third node N3 is at an invalid potential, the fourth transistor M4 is turned off, so as to disconnect the output terminal OUT from the second reference voltage terminal VGL. Because the third transistor M3 is turned on, the output terminal OUT is connected to the clock terminal CLK. Because CLK=0 in this case, the output signal of the output terminal OUT is also at an invalid potential.

In a time period P1 (a touch time period) after the time period T1, the touch scan signal Touch is valid, and IN=0, CLK=0, RST=0, TE=1. Because IN=0 and RST=0, the first transistor M1 and the second transistor M2 are turned off, and because IN=0 and CLK=0, the fifth transistor M5 is also turned off. However, due to the electricity storage effect of the second capacitor C2, the second node N2 still remains at a valid potential, so that the sixth transistor M6 remains to be turned on, thereby continuing to keep the first scan voltage terminal VDD and the first node N1 to be connected with each other, so that the high level voltage from the first scan voltage terminal VDD is supplied to the first node N1. In this way, the first control circuit 320 can maintain the potential at the first node N1 during the touch time period, thereby ensuring that the transistor M3 in the output circuit 330 can be sufficiently turned on. Because the first node N1 remains at the valid potential, and accordingly, the third transistor M3, the eighth transistor M8, and the eleventh transistor M11 remain to be turned on, in addition, the seventh transistor M7 remains to be turned on and the tenth transistor M10 remains to be turned off, so that the third node N3 and the fourth node N4 are still at an invalid potential, thereby turning off the fourth transistor M4. The third transistor M3 being turned on keeps the output terminal OUT to be connected to the clock terminal CLK. Because CLK=0 at this time, the output signal of the output terminal OUT is also at an invalid potential.

In a time period T2 (a display period) after the end of the time period P2, the touch scan signal Touch becomes an invalid potential, and IN=0, CLK=1, RST=0, TE=0. Because IN=0 and RST=0, the first transistor M1 and the second transistor M2 are turned off. Because IN=0 and CLK=1, the fifth transistor M5 is turned on and supplies the low level voltage from the touch enable signal terminal TE to the second node N2 to set the second node N2 to be at an invalid potential, and at the same time, the second capacitor C2 is discharged. Because the second node N2 is at an invalid potential, the sixth transistor M6 is turned off to disconnect the first scan voltage terminal VDD from the first node N1. In this case, the first node N1 continues to be at a valid potential, so that the third transistor M3, the eighth transistor M8, and the eleventh transistor M11 remain to be turned on. In addition, the seventh transistor M7 also remains to be turned on, and the tenth transistor M10 remains to be turned off. Therefore, the third node N3 and the fourth node N4 are still at an invalid potential, thereby turning off the fourth transistor M4. In particular, due to the bootstrap effect of the first capacitor C1, the potential at the first node N1 changes synchronously with the change of the potential at the output terminal OUT, as shown in FIG. 10, thereby further turning on the third transistor M3. The turned-on third transistor M3 enables the output terminal OUT be connected to the clock terminal CLK. Because CLK=1 at this time, the output of the output terminal OUT changes from a low level to a high level.

In a time period T3 (a display time period) after the end of the time period T2, IN=0, CLK=0, RST=1, TE=0. Because IN=0, the first transistor M1 is turned off, and because IN=0 and CLK=0, the fifth transistor M5 is turned off. Because the second capacitor C2 has been discharged, the second node N2 is at an invalid potential, so that the sixth transistor M6 is turned off. Because RST=1, the second transistor M2 is turned on to connect the second scan voltage terminal VSS to the first node N1, and therefore, the low level voltage from the second scan voltage terminal VSS is supplied to the first node N1 to enable the first node N1 be at an invalid potential, thereby achieving to reset the first node. Because N1 is at an invalid potential, the third transistor M3, the eighth transistor M8, and the eleventh transistor M11 are turned off, the third transistor M3 being turned off enables the output terminal OUT be disconnected from the clock terminal CLK. Because the seventh transistor M7 remains to be turned on and the eighth transistor M8 is turned off, the high level voltage of the first reference voltage terminal VGH is supplied to the fourth node N4, so that the fourth node N4 is at a valid potential. In the case where the fourth node N4 is at the valid potential, the tenth transistor M10 is turned on to supply the high level voltage of the first reference voltage terminal VGH to the third node N3, so that the third node N3 is at the valid potential. In the case where the third node N3 is at a valid potential, the fourth transistor M4 is turned on, so that the output terminal OUT is connected to the second reference voltage terminal VGL, and therefore, the low level of the second reference voltage terminal VGL is supplied to the output terminal OUT, so that the output of the output terminal OUT changes from a high level to a low level, thereby achieving to reset the output terminal OUT.

In the embodiments of the present disclosure, for example, in the case where each circuit is implemented as an n-type transistor, the term "pull-up" means charging a node or an electrode of a transistor so as to raise an absolute value of a level of the node or a level of the electrode, thereby implementing an operation (e.g., turn-on) of a corresponding transistor; the term "pull-down" means discharging a node or an electrode of a transistor, so that an absolute value of a level of the node or the electrode is decreased, thereby implementing an operation (e.g., turn-off) of the corresponding transistor.

For another example, in the case where each circuit is implemented as a P-type transistor, the term "pull-up" means discharging a node or an electrode of a transistor, so that an absolute value of a level of the node or the electrode is decreased, thereby achieving an operation (e.g., turn-on) of a corresponding transistor; and the term "pull-down" means charging a node or an electrode of a transistor, so that an absolute value of a level of the node or the electrode is increased, thereby achieving an operation (e.g., turn-off) of a corresponding transistor.

It should be noted that in the description of various embodiments of the present disclosure, the first node N1, the second node N2, the third node N3, and the fourth node N4 do not indicate that they are actual components, but indicate junction points of related electrical connections in the circuit diagram.

The transistors used in the embodiments of the present disclosure may all be thin film transistors, field effect transistors, or other switching devices with the like characteristics, and the embodiments of the present disclosure can be described by taking the thin film transistors as an example. A source electrode and a drain electrode of each transistor used here can be symmetrical in structure, so the source electrode and the drain electrode of the transistor may have no difference in structure. In the embodiments of the present disclosure, in order to distinguish two electrodes of a transistor except a gate electrode, one of the two electrodes is referred to as a first electrode described directly, and the other of the two electrodes is referred to as a second electrode. In addition, the transistors can be divided into n-type transistors and p-type transistors according to characteristics of the transistors. In the case where the transistor is a p-type transistor, the turn-on voltage is a low level voltage (for example, 0V, −5V, −10V, or other suitable voltage), and the turn-off voltage is a high level voltage (for example, 5V, 10V, or other suitable voltage); in the case where the transistor is an n-type transistor, the turn-on voltage is a high level voltage (for example, 5V, 10V, or other suitable voltage), and the turn-off voltage is a low level voltage (for example, 0V, −5V, −10V, or other suitable voltage).

In addition, the transistors in the embodiments of the present disclosure are all described by taking n-type transistors as an example. In this case, a first electrode of each transistor is a drain electrode, and a second electrode of each transistor is a source electrode. It should be noted that the present disclosure includes but is not limited to this case. For example, one or more transistors in the shift register unit 300 provided by the embodiment of the present disclosure may also adopt p-type transistors. In this case, a first electrode of each transistor is a source electrode, a second electrode of each transistor is a drain electrode, as long as respective electrodes of a selected-type transistor are correspondingly connected in accordance with respective electrodes of a corresponding transistor in the embodiment of the present disclosure, and the corresponding voltage terminals provide corresponding high voltages or low voltages. In the case where an n-type transistor is used, Iridium Gallium Zinc Oxide (IGZO) can be used as an active layer of the thin film transistor, which may effectively reduce the size of the transistor and prevent leakage current compared with using Low Temperature Poly Silicon (LTPS) or amorphous silicon (such as hydrogenated amorphous silicon) as the active layer of the thin film transistor.

In the shift register unit provided by the embodiments of the present disclosure, the first control circuit keeps supplying the first scan voltage to the first node when the touch enable signal is valid, thereby preventing the potential at the first node from decreasing due to leakage of the transistor during the touch time period, thus ensuring that the transistors in the output circuit can still be fully turned on after the touch time period ends, thereby ensuring the quality of the output pulse at the output terminal, which in turn enables the thin film transistors in the corresponding row to be fully turned on, ensures the charging for the pixels, and avoid appearing the dark lines.

Figure 11:
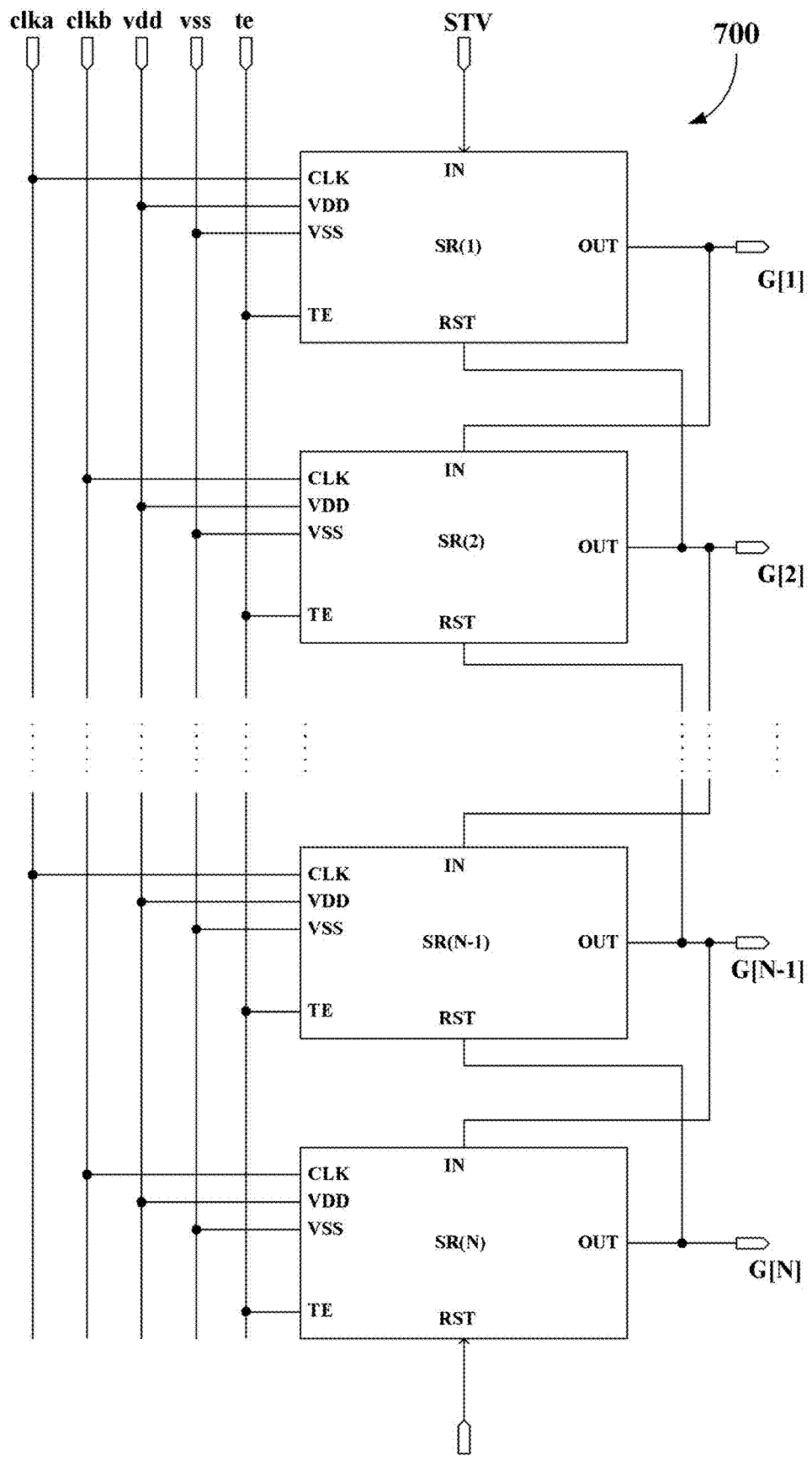
FIG. 11 is a block diagram of a gate driver based on the shift register unit of FIG. 5.

At least one embodiment of the present disclosure also provides a gate driver. FIG. 11 is a schematic block diagram of a gate driver 700 based on the shift register unit 300 as shown in FIG. 5. As shown in FIG. 11, the gate driver 700 includes N (N is an integer greater than or equal to 2) shift register units SR (1), SR (2), . . . , SR (N−1), and SR (N), which are cascaded, each of the N shift register units may adopt the structure of the shift register unit 300 as described above with respect to FIG. 5. N can be an integer greater than or equal to 2. In the gate driver 700, in addition to a first shift register unit SR (1), an input terminal IN of each shift register unit is connected to an output terminal OUT of an adjacent previous shift register unit, and in addition to an (N)-th shift register unit SR (N), a reset terminal RST of each shift register unit is connected to an output terminal OUT of a next adjacent shift register unit.

For example, an input terminal INT of a first shift register unit may be configured to receive a trigger signal STV, and a reset terminal RST of a last shift register unit may be configured to receive a reset signal (not shown in the figure).

For example, the N shift register units SR (1), SR (2), . . . , SR (N−1), and SR (N) in the gate driver 700 may be connected to N gate lines G [1], G [2], . . . , G [N−1], and G [N], respectively. Each of the shift register units can also be connected to a first scan voltage line vdd that can be used to transmit a first scan voltage, a second scan voltage line vss that can be used to transmit a second scan voltage, a touch enable signal line te that can be used to transmit a touch enable signal, a first clock line clka that can be used to transmit a first clock signal, and a second clock line clkb that can be used to transmit a second clock signal. The first clock signal and the second clock signal have opposite phases. In particular, a clock terminal CLK of a (2k−1)-th shift register unit in the shift register units SR (1), SR (2), . . . , SR (N−1), and SR (N) is connected to the first clock line clka, and a clock terminal CLK of a (2k)-th shift register unit in the shift register units SR (1), SR (2), . . . , SR (N−1), and SR (N) is connected to the second clock line clkb, k is a positive integer and 2k≤N. It will be understood that the first clock signal and the second clock signal are supplied to the shift register units SR (1), SR (2), . . . , SR (N−1), and SR (N) in such a way that each of the shift register units operates in the same (but "time shifted") timing to sequentially generate output signals as turn-on pulses of the gate electrodes.

Figure 12:
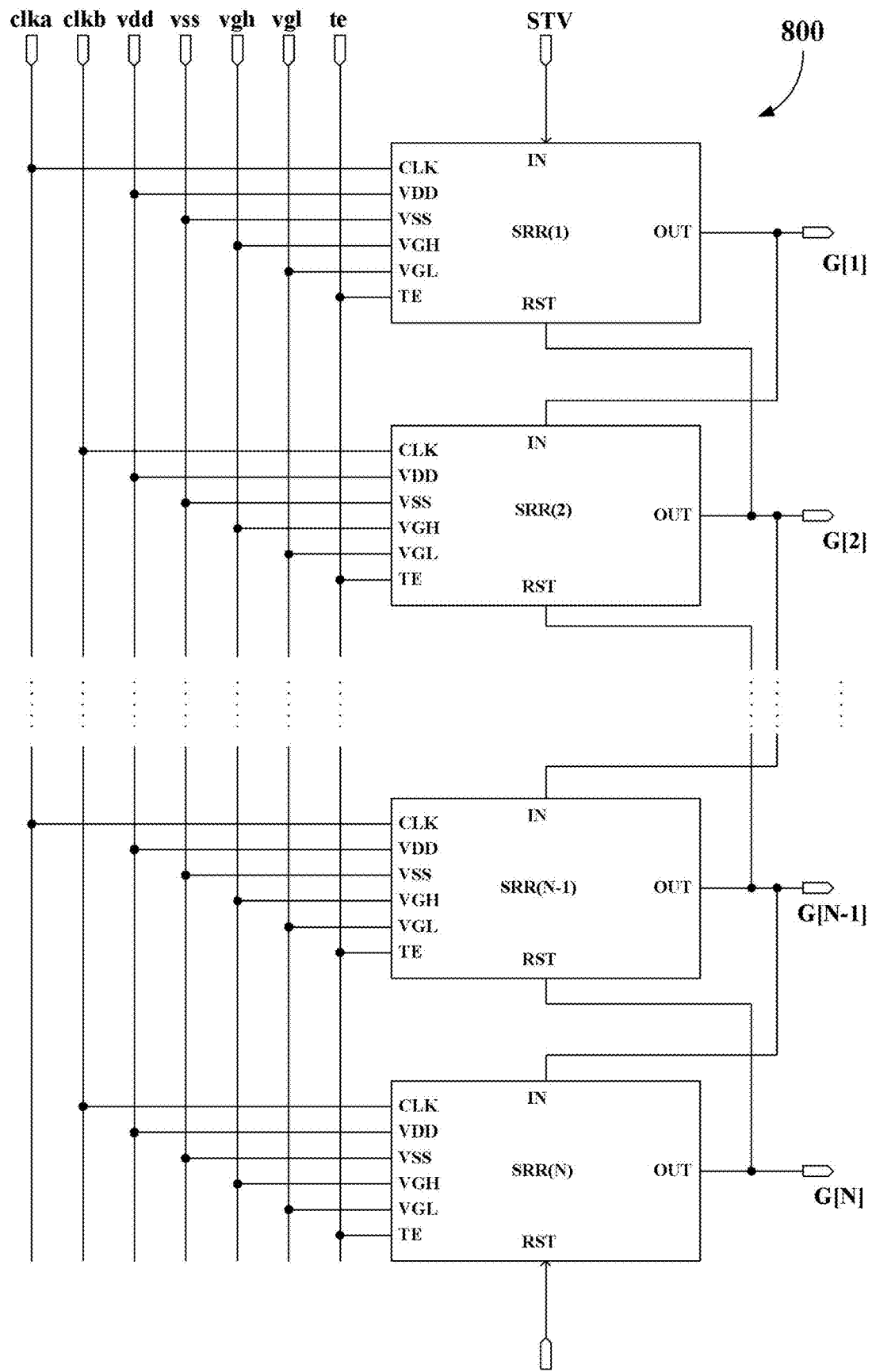
FIG. 12 is a block diagram of a gate driver based on the shift register unit of FIG. 8.

FIG. 12 is a block diagram of a gate driver 800 based on the shift register unit 500 of FIG. 8. The gate driver 800 includes N shift register units SRR (1), SRR (2), . . . , SRR (N−1), and SRR (N), which are cascaded, each of the N shift register units can take the form of the shift register unit 500 as described above with respect to FIG. 8. The gate driver 800 is similar to the gate driver 700, the only difference between the gate driver 800 and the gate driver 700 is that each of the shift register units in the gate driver 800 can also be connected to a first reference voltage line vgh that can be used to transmit a first reference voltage and a second reference voltage line vgl that can be used to transmit a second reference voltage.

It should be noted that in the case where the gate driver 700/800 provided by the embodiment of the present disclosure is used to drive a display panel, the gate driver 700/800 may be disposed on one side of the display panel. For example, the display panel includes a plurality of gate lines, and the output terminals of respective shift register units in the gate driver 700/800 may be configured to be coupled in one-to-one correspondence to the plurality of gate lines for outputting gate scan signals to the plurality of gate lines. It should be noted that the gate driver 700/800 may also be disposed on both sides of the display panel to achieve bilateral drive. The embodiments of the present disclosure do not limit the manner of setting the gate driver 700/800.

Figure 13:
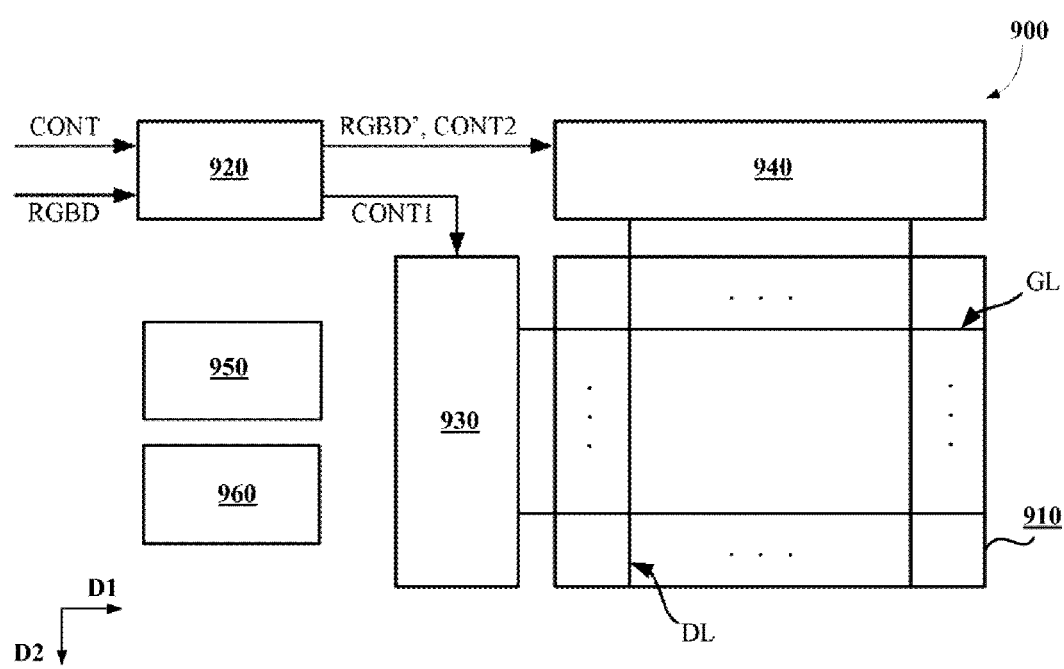
FIG. 13 is a block diagram of a touch display device according to an embodiment of the present disclosure.

At least one embodiment of the present disclosure also provides a touch display panel and a touch display device. FIG. 13 is a block diagram of a touch display device 900 according to an embodiment of the present disclosure. Referring to FIG. 13, the touch display device 900 includes a touch display panel 910, a timing controller 920, a gate driver 930, a data driver 940, a voltage generator 950, and a touch driver 960. The gate driver 930 may take the form of the gate driver 700 as shown in FIG. 11 or the gate driver 800 as shown in FIG. 12 above. In addition, the first clock line clka, the second clock line clkb, the first scan voltage line vdd, the second scan voltage line vss, the touch enable signal line te, the first reference voltage line vgh, and the second reference voltage line vgl as shown in FIGS. 11 and 12 are omitted in FIG. 13 for convenience of illustration.

The touch display panel 910 is used to display the received image data and sense the touch operation of the user on the touch display panel 910. The touch display panel 910 may have various types of structures, such as add-on, in-cell, on-cell, OGS, and so on. The touch display panel 910 includes a plurality of gate lines GL extending in a first direction D1 and a plurality of data lines DL extending in a second direction D2 crossing (e.g., substantially perpendicular) to the first direction D1. The display panel of the touch display panel 910 includes a plurality of pixels (not shown) arranged in a matrix. Each of the pixels may be electrically connected to a corresponding gate line of the gate lines GL and a corresponding data line of the data lines DL. The display panel of the touch display panel 910 may be a liquid crystal display panel, an organic light-emitting diode (OLED) display panel, or any other suitable type of display panel.

For example, the touch display panel 910 includes: a first scan voltage line configured to transmit a first scan voltage; a second scan voltage line configured to transmit a second scan voltage; a touch enable signal line configured to transmit a touch enable signal; a first clock line configured to transmit a first clock signal; a second clock line configured to transmit a second clock signal, the first clock signal and the second clock signal having opposite phases; and the gate driver 930.

For example, the respective first scan voltage terminals of the N shift register units are connected to the first scan voltage line to receive the first scan voltage, and the respective second scan voltage terminals of the N shift register units are connected to the second scan voltage line to receive the second scan voltage, the respective touch enable signal terminals of the N shift register units are connected to the touch enable signal line to receive the touch enable signal, the clock terminal of the (2k−1)-th shift register unit in the N shift register units is connected to the first clock line to receive the first clock signal, and the clock terminal of the (2k)-th shift register unit in the N shift register units is connected to the second clock line to receive the second clock signal line, k is a positive integer and 2k≤N. For specific introduction, please refer to the introduction of FIG. 11 and FIG. 12, and the similar portions will not be repeated here again.

It should be noted that the touch display panel 910 provided in the embodiment of the present disclosure may further include 4, 6, 8, or more clock lines, and the embodiments of the present disclosure do not limit the amount of the clock lines. Correspondingly, the connection relationship between the clock terminal of each shift register unit and the clock line may depend on specific situations, and the embodiments of the present disclosure are not limited thereto.

The timing controller 920 controls the operations of the touch display panel 910, the gate driver 930, the data driver 940, the voltage generator 950, and the touch driver 960. The timing controller 920 receives input image data RGBD and an input control signal CONT from an external device (for example, a host). The input image data RGBD may include a plurality of input pixel data for a plurality of pixels. Each input pixel data may include red gray data R, green gray data G, and blue gray data B for a corresponding pixel of the plurality of pixels. The input control signal CONT may include a main clock signal, a data enable signal, a vertical synchronization signal, a horizontal synchronization signal, and so on. The timing controller 920 generates output image data RGBD', a first control signal CONT1, and a second control signal CONT2 based on the input image data RGBD and the input control signal CONT. The implementation manner of the timing controller 920 may adopt an implementation manner in the art, and will not be repeated here again. The timing controller 920 may be implemented in many ways (for example, such as implemented with a dedicated hardware) to perform various functions involved in the embodiments of the present disclosure. A "processor" is an example of the timing controller 920 that adopts one or more microprocessors. The microprocessor can be programmed using software (e.g., microcode) to perform various functions related to the embodiments of the present disclosure. The timing controller 920 may be implemented with or without a processor, and may also be implemented as a combination of a dedicated hardware that performs some functions and a processor that performs other functions. Examples of the timing controller 920 include, but are not limited to, conventional microprocessors, application specific integrated circuits (ASIC s), and field programmable gate arrays (FPGAs).

The gate driver 930 receives the first control signal CONT1 from the timing controller 920. The first control signal CONT1 may include the first clock signal and the second clock signal that are transmitted through the first clock line clk and the second clock line clkb as shown in FIGS. 11 and 12 and have opposite phases. The gate driver 930 generates, based on the first control signal CONT1, a plurality of gate driving signals used for outputting to the gate lines GL. The gate driver 930 may sequentially apply the plurality of gate driving signals to the gate lines GL, thereby applying the gate driving signals to the pixel unis in a corresponding row through the gate lines GL.

The data driver 940 receives the second control signal CONT2 and the output image data RGBD' from the timing controller 920. The data driver 940 generates a plurality of data voltages based on the second control signal CONT2 and the output image data RGBD'. The data driver 940 may apply the generated plurality of data voltages to the data lines DL to apply the data voltages to the pixel units in a corresponding column through the data lines DL.

The touch driver 960 may be configured to generate a touch scan signal Touch in response to the touch enable signal and supply the touch scan signal Touch to the touch display panel 910, and also be configured to receive a sensing result from the touch display panel 910.

The voltage generator 950 supplies power to the touch display panel 910, the timing controller 920, the gate driver 930, the data driver 940, the touch driver 960, and potential other components. Specifically, the voltage generator 950 is configured to, under the control of the timing controller 920, supply the first scan voltage, the second scan voltage, the first reference voltage, and the second reference voltage, which are transmitted by the first scan voltage line vdd, the second scan voltage line vss, the first reference voltage line vgh, and the second reference voltage line vgl as shown in FIGS. 11 and 12, respectively. The configuration of the voltage generator 950 may be implemented by the methods in the art, which will not be repeated here again. In one implementation, the voltage generator 950 may include a voltage converter such as a DC/DC converter and a crossbar switch. The voltage converter generates a plurality of output voltages with different voltage levels from the input voltage. Then, the crossbar switch can, under control of the timing controller 920, selectively couple these output voltages to the first scan voltage line vdd, the second scan voltage line vss, the first reference voltage line vgh, and the second reference voltage line vgl, in order to supply the first scan voltage and the second scan voltage that are required and supply the first reference voltage and second reference voltage if necessary.

In various embodiments, the gate driver 930 and/or the data driver 940 may be disposed on the touch display panel 910, or may be connected to the touch display panel 910 by, for example, a tape carrier package (TCP). For example, the gate driver 930 may be integrated in the touch display panel 910 as a gate driver on array (GOA) circuit.

Examples of the touch display device 900 include, but are not limited to, a mobile phone, a tablet computer, a television, a monitor, a notebook computer, a digital photo frame, and a navigator.

For the technical effects of the touch display panel 700/ 800 and the touch display device 900 provided by the embodiments of the present disclosure, reference may be made to the corresponding descriptions of the shift register unit in the foregoing embodiments, and details are not repeated herein again.

At least one embodiment of the present disclosure also provides a driving method for driving a shift register unit. In some examples, the driving method includes:

by the input circuit, controlling the level of the first node in response to the input pulse received at the input terminal;

under control of the input pulse received at the input terminal and the touch enable signal received at the touch enable signal terminal, by the first control circuit, connecting the first scan voltage terminal to the first node to control the level of the first node; and in response to the potential of the first node, by the output circuit, connecting the clock terminal to the output terminal to output the clock signal received by the clock terminal at the output terminal.

In other examples, the driving method further includes:

under control of the input pulse received at the input terminal, the clock signal received at the clock terminal, and the touch enable signal received at the touch enable signal terminal, by the first control circuit, disconnecting the first scan voltage terminal from the first node to control the level of the first node.

For example, the clock signal has a duty cycle of 50%, the input pulse has a pulse width, which is equal to half of a period of the clock signal, and is synchronized with a duration of an invalid potential of the clock signal, and the reset pulse has a pulse width, which is equal to half of the period of the clock signal, and is delayed by half of the period of the clock signal relative to the output pulse of the output terminal.

For the technical effect of the driving method for driving the shift register unit provided by the embodiment of the present disclosure, reference may be made to the corresponding description about the shift register unit in the foregoing embodiment, and details are not repeated here.

The following points need to be explained:

(1) The drawings of the embodiments of the present disclosure relate only to the structures related to the embodiments of the present disclosure, and other structures may refer to the general design.

(2) In case of no conflict, the embodiments of the present disclosure and the features in the embodiments can be combined with each other to obtain new embodiments.

What have been described above are only specific implementations of the present disclosure, the protection scope of the present disclosure is not limited thereto. The protection scope of the present disclosure should be based on the protection scope of the claims.

What is claimed is:

1. A shift register unit, comprising:
an input circuit, wherein the input circuit is connected to an input terminal and a first node, and is configured to control a level of the first node in response to an input pulse received at the input terminal;
a first control circuit, wherein the first control circuit is connected to the input terminal, a first scan voltage terminal, a touch enable signal terminal, and the first node, and is configured to, under control of the input pulse received at the input terminal and a touch enable signal received at the touch enable signal terminal, connect the first scan voltage terminal to the first node to control the level of the first node; and
an output circuit, wherein the output circuit is connected to the first node, a clock terminal, and an output terminal, and is configured to connect the clock terminal to the output terminal in response to a potential of the first node, to output a clock signal received by the clock terminal at the output terminal.

2. The shift register unit according to claim 1, wherein the first control circuit is further connected to the clock terminal to receive the clock signal, and is configured to, under control of the input pulse received at the input terminal, the clock signal received at the clock terminal, and the touch enable signal received at the touch enable signal terminal, disconnect the first scan voltage terminal from the first node to control the level of the first node.

3. The shift register unit according to claim 1, further comprising:
a reset circuit, wherein the reset circuit is connected to a reset terminal and the first node, and is configured to reset the first node under control of a reset pulse received by the reset terminal.

4. The shift register unit according to claim 1, wherein the input circuit comprises:
a first transistor, wherein a gate electrode of the first transistor is connected to the input terminal to receive the input pulse, and a first electrode of the first transistor is connected to the first scan voltage terminal to receive a first scan voltage, and a second electrode of the first transistor is connected to the first node.

5. The shift register unit according to claim 3, wherein the reset circuit comprises:
a second transistor, wherein a gate electrode of the second transistor is connected to the reset terminal to receive the reset pulse, a first electrode of the second transistor is connected to the first node, and a second electrode of the second transistor is connected to a second scan voltage terminal to receive a second scan voltage.

6. The shift register unit according to claim 1, wherein the output circuit comprises:
a third transistor, wherein a gate electrode of the third transistor is connected to the first node, a first electrode of the third transistor is connected to the clock terminal to receive the clock signal, and a second electrode of the third transistor is connected to the output terminal; and
a first capacitor, wherein a first electrode of the first capacitor is connected to the first node, and a second electrode of the first capacitor is connected to the output terminal.

7. The shift register unit according to claim 2, wherein the first control circuit comprises:
a fifth transistor, comprising a first gate electrode and a second gate electrode, wherein the first gate electrode of the fifth transistor is connected to the input terminal to receive the input pulse, the second gate electrode of the fifth transistor is connected to the clock terminal to receive the clock signal, a first electrode of the fifth transistor is connected to the touch enable signal terminal to receive the touch enable signal, and a second electrode of the fifth transistor is connected to a second node;
a sixth transistor, wherein a gate electrode of the sixth transistor is connected to the second node, a first electrode of the sixth transistor is connected to the first scan voltage terminal to receive a first scan voltage, and a second electrode of the sixth transistor is connected to the first node; and
a second capacitor, wherein a first electrode of the second capacitor is connected to the first node, and a second electrode of the second capacitor is grounded; or,
the first control circuit comprises:
a fifth transistor, wherein a gate electrode of the fifth transistor is connected to the input terminal to receive the input pulse, a first electrode of the fifth transistor is connected to the touch enable signal terminal to receive the touch enable signal, and a second electrode of the fifth transistor is connected to a second node;
a twelfth transistor, wherein a gate electrode of the twelfth transistor is connected to the clock terminal to receive the clock signal, a first electrode of the twelfth transistor is connected to the touch enable signal terminal to receive the touch enable signal, and a second electrode of the twelfth transistor is connected to the second node;
a sixth transistor, wherein a gate electrode of the sixth transistor is connected to the second node, a first electrode of the sixth transistor is connected to the first scan voltage terminal to receive a first scan voltage, and a second electrode of the sixth transistor is connected to the first node; and
a second capacitor, wherein a first electrode of the second capacitor is connected to the first node, and a second electrode of the second capacitor is grounded.

8. The shift register unit according to claim 3, further comprising:
a second control circuit, wherein the second control circuit is connected to the first node, a third node, and a fourth node, and is configured to control a level of the third node in response to the level of the first node and a level of the fourth node.

9. The shift register unit according to claim 8, further comprising:
   a first node noise reduction circuit, wherein the first node noise reduction circuit is connected to the first node and the third node, and is configured to perform noise reduction on the first node in response to the level of the third node.

10. The shift register unit according to claim 8, further comprising:
   an output noise reduction circuit, wherein the output noise reduction circuit is connected to the reset terminal and the output terminal, and is configured to perform noise reduction on the output terminal under control of the reset pulse received by the reset terminal; or
   the output noise reduction circuit is connected to the third node and the output terminal, and is configured to perform noise reduction on the output terminal under control of the level of the third node.

11. The shift register unit according to claim 10, wherein the output noise reduction circuit comprises:
   a fourth transistor, wherein a gate electrode of the fourth transistor is connected to the reset terminal or the third node, a first electrode of the fourth transistor is connected to the output terminal, and a second electrode of the fourth transistor is connected to a second reference voltage terminal to receive a second reference voltage.

12. The shift register unit according to claim 8, wherein the second control circuit comprises:
   a seventh transistor, wherein both a gate electrode and a first electrode of the seventh transistor are connected to a first reference voltage terminal to receive a first reference voltage, and a second electrode of the seventh transistor is connected to the fourth node;
   an eighth transistor, wherein a gate electrode of the eighth transistor is connected to the first node, a first electrode of the eighth transistor is connected to the fourth node, and a second electrode of the eighth transistor is connected to a second reference voltage terminal to receive a second reference voltage;
   a tenth transistor, wherein a gate electrode of the tenth transistor is connected to the fourth node, a first electrode of the tenth transistor is connected to the first reference voltage terminal to receive the first reference voltage, and a second electrode of the tenth transistor is connected to the third node; and
   an eleventh transistor, wherein a gate electrode of the eleventh transistor is connected to the first node, a first electrode of the eleventh transistor is connected to the third node, and a second electrode of the eleventh transistor is connected to the second reference voltage terminal to receive the second reference voltage.

13. The shift register unit according to claim 9, wherein the first node noise reduction circuit comprises:
   a ninth transistor, wherein a gate electrode of the ninth transistor is connected to the third node, a first electrode of the ninth transistor is connected to the first node, and a second electrode of the ninth transistor is connected to a second reference voltage terminal to receive a second reference voltage.

14. A gate driver, comprising N shift register units, which are cascaded, according to claim 1,
   wherein an output terminal of an (m)-th shift register unit in the N shift register units is connected to an input terminal of an (m+1)-th shift register unit in the N shift register units; and
   an output terminal of an (n)-th shift register unit in the N shift register units is connected to a reset terminal of an (n−1)-th shift register unit in the N shift register units,
   wherein N is an integer greater than or equal to 2, m is an integer and 1≤m≤N, and n is an integer and 1<n≤N.

15. A touch display panel, comprising:
   a first scan voltage line, configured to transmit a first scan voltage;
   a second scan voltage line, configured to transmit a second scan voltage;
   a touch enable signal line, configured to transmit a touch enable signal;
   a first clock line, configured to transmit a first clock signal;
   a second clock line, configured to transmit a second clock signal, wherein a phase of the first clock signal and a phase of the second clock signal are opposite; and
   the gate driver according to claim 14,
   wherein respective first scan voltage terminals of the N shift register units are connected to the first scan voltage line to receive the first scan voltage,
   respective second scan voltage terminals of the N shift register units are connected to the second scan voltage line to receive the second scan voltage,
   respective touch enable signal terminals of the N shift register units are connected to the touch enable signal line to receive the touch enable signal,
   a clock terminal of a (2k−1)-th shift register unit in the N shift register units is connected to the first clock line to receive the first clock signal, and a clock terminal of a (2k)-th shift register unit in the N shift register units is connected to the second clock line to receive the second clock signal,
   wherein k is a positive integer and 2k≤N.

16. A touch display device, comprising the touch display panel according to claim 15.

17. The touch display device according to claim 16, further comprising:
   a timing controller, configured to control an operation of the touch display panel, wherein the timing controller is configured to:
      provide the first clock signal and the second clock signal to the first clock line and the second clock line, respectively; and
      provide the touch enable signal to the touch enable signal line, wherein during a period in a case where the touch enable signal is valid, the first clock signal and the second clock signal are invalid;
   a touch driver, configured to generate a touch scan signal in response to the touch enable signal; and
   a voltage generator, configured to at least provide the first scan voltage and the second scan voltage to the first scan voltage line and the second scan voltage line, respectively.

18. A driving method for driving the shift register unit according to claim 1, comprising:
   by the input circuit, controlling the level of the first node in response to the input pulse received at the input terminal;
   under control of the input pulse received at the input terminal and the touch enable signal received at the touch enable signal terminal, by the first control circuit, connecting the first scan voltage terminal to the first node to control the level of the first node; and
   in response to the potential of the first node, by the output circuit, connecting the clock terminal to the output terminal to output the clock signal received by the clock terminal at the output terminal.

19. The driving method according to claim 18, further comprising:

under control of the input pulse received at the input terminal, the clock signal received at the clock terminal, and the touch enable signal received at the touch enable signal terminal, by the first control circuit, disconnecting the first scan voltage terminal from the first node to control the level of the first node.

20. The driving method according to claim 18, wherein the clock signal has a duty cycle of 50%, the input pulse has a pulse width, which is equal to half of a period of the clock signal, and is synchronized with a duration of an invalid potential of the clock signal, and wherein shift register further comprises a reset circuit, wherein the reset circuit is connected to a reset terminal and the first node, and is configured to reset the first node under control of a reset pulse received by the reset terminal, and wherein the reset pulse has a pulse width, which is equal to half of the period of the clock signal, and is delayed by half of the period of the clock signal relative to an output pulse of the output terminal.

\* \* \* \* \*